(12) United States Patent
Zhang et al.

(10) Patent No.: US 11,133,572 B2
(45) Date of Patent: Sep. 28, 2021

(54) ELECTRONIC DEVICE WITH SEGMENTED HOUSING HAVING MOLDED SPLITS

(71) Applicant: Apple Inc., Cupertino, CA (US)

(72) Inventors: Yaocheng Zhang, Cupertino, CA (US); John J. Baker, Cupertino, CA (US); Martin J. Auclair, Waterloo (CA); Paul U. Leutheuser, Saratoga, CA (US); Christopher J. Durning, Cupertino, CA (US); Jun Ham, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 99 days.

(21) Appl. No.: 16/205,145

(22) Filed: Nov. 29, 2018

(65) Prior Publication Data
US 2020/0076058 A1 Mar. 5, 2020

Related U.S. Application Data

(60) Provisional application No. 62/725,197, filed on Aug. 30, 2018, provisional application No. 62/729,319, filed on Sep. 10, 2018.

(51) Int. Cl.
*H01Q 1/24* (2006.01)
*H01Q 1/22* (2006.01)
(Continued)

(52) U.S. Cl.
CPC ............ *H01Q 1/243* (2013.01); *G06F 1/181* (2013.01); *H01Q 1/2258* (2013.01); *H01Q 1/38* (2013.01);
(Continued)

(58) Field of Classification Search
CPC ........ H01Q 1/243; H01Q 1/2258; H01Q 1/38; H01Q 9/30; H01Q 9/045; H01Q 13/10; H04B 1/3888; G06F 1/181; H05K 5/0247
See application file for complete search history.

(56) References Cited

U.S. PATENT DOCUMENTS

| 4,106,839 A | 8/1978 | Cooper |
| 4,256,412 A | 3/1981 | Tybus et al. |

(Continued)

FOREIGN PATENT DOCUMENTS

| CN | 101087500 | 12/2007 |
| CN | 102159045 | 8/2011 |

(Continued)

OTHER PUBLICATIONS

Author Unknown, "Improved Touchscreen Products," Research Disclosure, Kenneth Mason Publications, Hampshire, UK, GB, vol. 428, No. 53, Dec. 1, 1999.

(Continued)

*Primary Examiner* — Dieu Hien T Duong
(74) *Attorney, Agent, or Firm* — Brownstein Hyatt Farber Schreck, LLP

(57) ABSTRACT

The disclosure is directed to a multi-segment housing for an electronic device that includes multiple conductive segments that are structurally coupled by one or more non-conductive housing segments or splits. One or more of the conductive segments may be configured to operate as an antenna and the non-conductive housing segments may provide electrical insulation between the conductive segment and one or more adjacent housing segments. The non-conductive housing segment may be formed from a polymer having an array of fibers dispersed within the polymer. The fibers may be aligned along one or more fiber directions, which may be substantially perpendicular to an exterior surface of the housing.

17 Claims, 21 Drawing Sheets

(51) Int. Cl.
  *H01Q 1/38* (2006.01)
  *H04B 1/3888* (2015.01)
  *G06F 1/18* (2006.01)
  *H01Q 9/30* (2006.01)
  *H01Q 9/04* (2006.01)
  *H05K 5/02* (2006.01)
  *H01Q 13/10* (2006.01)

(52) U.S. Cl.
  CPC ............... *H01Q 9/045* (2013.01); *H01Q 9/30* (2013.01); *H01Q 13/10* (2013.01); *H04B 1/3888* (2013.01); *H05K 5/0247* (2013.01)

(56) References Cited

U.S. PATENT DOCUMENTS

| | | |
|---|---|---|
| 4,855,174 A | 8/1989 | Kamamoto et al. |
| 4,989,622 A | 2/1991 | Kozuka et al. |
| 5,055,347 A | 10/1991 | Bacon, Jr. |
| 5,512,374 A | 4/1996 | Wallace et al. |
| 6,061,104 A | 5/2000 | Evanicky et al. |
| 6,093,887 A | 7/2000 | Ponto et al. |
| 6,189,938 B1 | 2/2001 | Nakadaira et al. |
| 6,288,330 B1 | 9/2001 | Chen |
| 6,359,768 B1 | 3/2002 | Eversley et al. |
| 6,392,873 B1 | 5/2002 | Honda |
| 6,442,826 B1 | 9/2002 | Staudt et al. |
| 6,473,069 B1 | 10/2002 | Gerpheide |
| 6,483,024 B1 | 11/2002 | Smithson et al. |
| 6,589,891 B1 | 7/2003 | Rast |
| 6,654,256 B2 | 11/2003 | Gough |
| 6,671,160 B2 | 12/2003 | Hayden |
| 6,940,731 B2 | 9/2005 | Davis et al. |
| 6,996,425 B2 | 2/2006 | Watanabe |
| 7,048,242 B2 | 5/2006 | Oddsen, Jr. |
| 7,436,653 B2 | 10/2008 | Yang et al. |
| 7,491,900 B1 | 2/2009 | Peets et al. |
| 7,586,753 B2 | 9/2009 | Lu |
| 7,604,377 B2 | 10/2009 | Yu et al. |
| 7,755,913 B2 | 7/2010 | He |
| 7,829,812 B2 | 11/2010 | Tolbert et al. |
| 7,920,904 B2 | 4/2011 | Kim et al. |
| 7,986,525 B2 | 7/2011 | Wang |
| 8,066,233 B2 | 11/2011 | Fujikawa et al. |
| 8,092,897 B2 | 1/2012 | Honma et al. |
| 8,101,859 B2 | 1/2012 | Zadesky |
| 8,164,898 B2 | 4/2012 | Lin et al. |
| D660,193 S | 5/2012 | Neuner |
| 8,195,244 B2 | 6/2012 | Smoyer et al. |
| 8,199,488 B2 | 6/2012 | Zou et al. |
| 8,358,513 B2 | 1/2013 | Kim et al. |
| 8,396,521 B2 | 3/2013 | Horimoto et al. |
| 8,456,847 B2 | 6/2013 | Hwang et al. |
| 8,509,863 B2 | 8/2013 | Vedurmudi et al. |
| 8,553,907 B2 | 10/2013 | Thomason et al. |
| 8,558,977 B2 | 10/2013 | Gettemy et al. |
| 8,587,935 B2 | 11/2013 | Lee |
| 8,654,524 B2 | 2/2014 | Pance et al. |
| 8,665,236 B2 | 3/2014 | Myers |
| 8,675,359 B2 | 3/2014 | Chen |
| 8,681,115 B2 | 3/2014 | Kurita |
| 8,744,529 B2 | 6/2014 | Freund et al. |
| 8,773,848 B2 | 7/2014 | Russell-Clarke et al. |
| 8,824,140 B2 | 9/2014 | Prest et al. |
| 8,974,924 B2 | 3/2015 | Weber et al. |
| 8,975,540 B2 | 3/2015 | Mareno et al. |
| 9,007,748 B2 | 4/2015 | Jarvis |
| 9,086,748 B2 | 7/2015 | Nam et al. |
| 9,124,676 B2 | 9/2015 | Allore et al. |
| 9,135,944 B2 | 9/2015 | Jenks |
| 9,162,519 B2 | 10/2015 | Suehiro et al. |
| 9,173,306 B2 | 10/2015 | Lim et al. |
| 9,203,463 B2 | 12/2015 | Asrani et al. |
| 9,218,116 B2 | 12/2015 | Benko et al. |
| 9,250,659 B2 | 2/2016 | Tsai et al. |
| 9,390,869 B2 | 7/2016 | Lee et al. |
| 9,429,997 B2 | 8/2016 | Myers et al. |
| 9,448,631 B2 | 9/2016 | Winter et al. |
| 9,489,054 B1 | 11/2016 | Sumsion et al. |
| 9,532,723 B2 | 1/2017 | Kim et al. |
| 9,642,241 B2 | 5/2017 | Huitema et al. |
| 9,740,237 B2 | 8/2017 | Moore et al. |
| 9,804,635 B2 | 10/2017 | Kim et al. |
| 9,826,649 B2 | 11/2017 | Narajowski et al. |
| 9,898,903 B2 | 2/2018 | Khoshkava et al. |
| 9,955,603 B2 | 4/2018 | Kiple et al. |
| 10,013,075 B2 | 7/2018 | Shipman |
| 10,042,442 B2 | 8/2018 | Kwak |
| 10,110,267 B2 | 10/2018 | Kim et al. |
| 10,321,590 B2 | 6/2019 | Cater et al. |
| 10,424,765 B2 | 9/2019 | Hwang et al. |
| 10,468,753 B2 | 11/2019 | Kim et al. |
| 10,705,570 B2 | 7/2020 | Kuna et al. |
| 2002/0072335 A1 | 6/2002 | Watanabe |
| 2002/0130981 A1 | 9/2002 | Ma et al. |
| 2004/0190239 A1 | 9/2004 | Weng |
| 2005/0140565 A1 | 6/2005 | Krombach |
| 2007/0195495 A1 | 8/2007 | Kim et al. |
| 2007/0287512 A1 | 12/2007 | Kilpi et al. |
| 2008/0084384 A1 | 4/2008 | Gregorio et al. |
| 2008/0174037 A1 | 7/2008 | Chen |
| 2009/0041984 A1 | 2/2009 | Mayers et al. |
| 2010/0137043 A1 | 6/2010 | Horimoto et al. |
| 2010/0151925 A1 | 6/2010 | Vedurmudi et al. |
| 2010/0265182 A1 | 10/2010 | Ball et al. |
| 2010/0315399 A1 | 12/2010 | Jacobson et al. |
| 2011/0047459 A1 | 2/2011 | Van Der Westhuizen |
| 2011/0065479 A1 | 3/2011 | Nader |
| 2011/0095994 A1 | 4/2011 | Birnbaum |
| 2011/0205169 A1 | 8/2011 | Yasutake et al. |
| 2012/0088072 A1 | 4/2012 | Pawloski et al. |
| 2012/0175165 A1 | 7/2012 | Merz et al. |
| 2012/0236477 A1 | 9/2012 | Weber |
| 2013/0051000 A1 | 2/2013 | Yu et al. |
| 2013/0273295 A1 | 10/2013 | Kenney et al. |
| 2014/0015773 A1 | 1/2014 | Loeffler |
| 2014/0368455 A1 | 12/2014 | Croisonnier et al. |
| 2015/0090571 A1 | 4/2015 | Leong et al. |
| 2015/0109223 A1 | 4/2015 | Kessler et al. |
| 2015/0124401 A1 | 5/2015 | Prest et al. |
| 2015/0183185 A1 | 7/2015 | Chang |
| 2015/0185946 A1 | 7/2015 | Fourie |
| 2015/0255853 A1 | 9/2015 | Kwong et al. |
| 2016/0098107 A1 | 4/2016 | Morrell et al. |
| 2016/0103544 A1 | 4/2016 | Filiz et al. |
| 2016/0147257 A1 | 5/2016 | Yamazaki |
| 2016/0270247 A1 | 9/2016 | Jones et al. |
| 2016/0308563 A1 | 10/2016 | Ouyang et al. |
| 2016/0309007 A1* | 10/2016 | Irci .................. H01Q 1/243 |
| 2017/0010771 A1 | 1/2017 | Bernstein et al. |
| 2017/0264722 A1 | 9/2017 | Zhong |
| 2018/0210515 A1 | 7/2018 | Lyles et al. |
| 2018/0213660 A1 | 7/2018 | Prest et al. |
| 2018/0217668 A1 | 8/2018 | Ligtenberg et al. |
| 2018/0217669 A1 | 8/2018 | Ligtenberg et al. |
| 2018/0218859 A1 | 8/2018 | Ligtenberg et al. |
| 2018/0284845 A1 | 10/2018 | Honma et al. |
| 2019/0101960 A1 | 4/2019 | Silvanto et al. |
| 2019/0361543 A1 | 11/2019 | Zhang |
| 2019/0377385 A1 | 12/2019 | Bushnell |
| 2020/0057525 A1 | 2/2020 | Prest et al. |
| 2020/0076056 A1 | 3/2020 | Froese et al. |
| 2020/0076057 A1 | 3/2020 | Leutheuser et al. |
| 2020/0278747 A1 | 9/2020 | Ligtenberg et al. |

FOREIGN PATENT DOCUMENTS

| | | |
|---|---|---|
| CN | 202281978 | 6/2012 |
| CN | 102984904 | 3/2013 |
| CN | 203054674 | 7/2013 |
| CN | 103390793 | 11/2013 |
| CN | 203416294 | 1/2014 |
| CN | 104742308 | 7/2015 |
| CN | 105228966 | 1/2016 |

(56) References Cited

FOREIGN PATENT DOCUMENTS

| | | |
|---|---|---|
| CN | 107221506 | 9/2017 |
| CN | 107275751 | 10/2017 |
| CN | 107735903 | 2/2018 |
| CN | 108400425 | 8/2018 |
| EP | 2565742 | 3/2013 |
| EP | 2843501 | 3/2015 |
| EP | 2993730 | 3/2016 |
| EP | 3144768 | 3/2017 |
| EP | 3438786 | 2/2019 |
| GB | 2516439 | 1/2015 |
| GB | 2529885 | 3/2016 |
| JP | S58151619 | 9/1983 |
| JP | H61039144 | 2/1986 |
| JP | H10102265 | 4/1998 |
| JP | H63249697 | 10/1998 |
| JP | 2001216077 | 8/2001 |
| JP | 20023431 F | 11/2002 |
| JP | 2004272690 | 9/2004 |
| JP | 2006243812 | 9/2006 |
| JP | 2007072375 | 3/2007 |
| JP | 2011014149 | 1/2011 |
| JP | 2011239139 | 11/2011 |
| JP | 2011248888 | 12/2011 |
| JP | 2012027592 | 2/2012 |
| JP | 2012222553 | 11/2012 |
| JP | 2013508818 | 3/2013 |
| JP | 2014186075 | 10/2014 |
| JP | 2015031952 | 2/2015 |
| KR | 20110049416 | 5/2011 |
| KR | 20150012312 | 2/2015 |
| KR | 20160019833 | 2/2016 |
| KR | 20160052275 | 5/2016 |
| KR | 20160134504 | 11/2016 |
| TW | 201129285 | 8/2011 |
| TW | 201532835 | 9/2015 |
| TW | 201701119 | 1/2017 |
| WO | WO2009/002605 | 12/2008 |
| WO | WO2009/049331 | 4/2009 |
| WO | WO2009/129123 | 10/2009 |
| WO | WO2012/129247 | 9/2012 |
| WO | WO2014/037945 | 3/2014 |
| WO | WO2015/153701 | 10/2015 |
| WO | WO2016/039803 | 3/2016 |
| WO | WO2016/053901 | 4/2016 |
| WO | WO2018/013573 | 1/2018 |
| WO | WO2018/142132 | 8/2018 |

OTHER PUBLICATIONS

Kim et al., "Ultrathin Cross-Linked Perfluoropolyether Film Coatings from Liquid $CO_2$ and Subsequent UV Curing," Chem. Matter, vol. 22, pp. 2411-2413, 2010.

Author Unknown, "Smart Watch—New Fashion Men/women Bluetooth Touch Screen Smart Watch Wrist Wrap Watch Phone," https://www.fargoshopping.co.ke/, 5 pages, Mar. 2016.

* cited by examiner

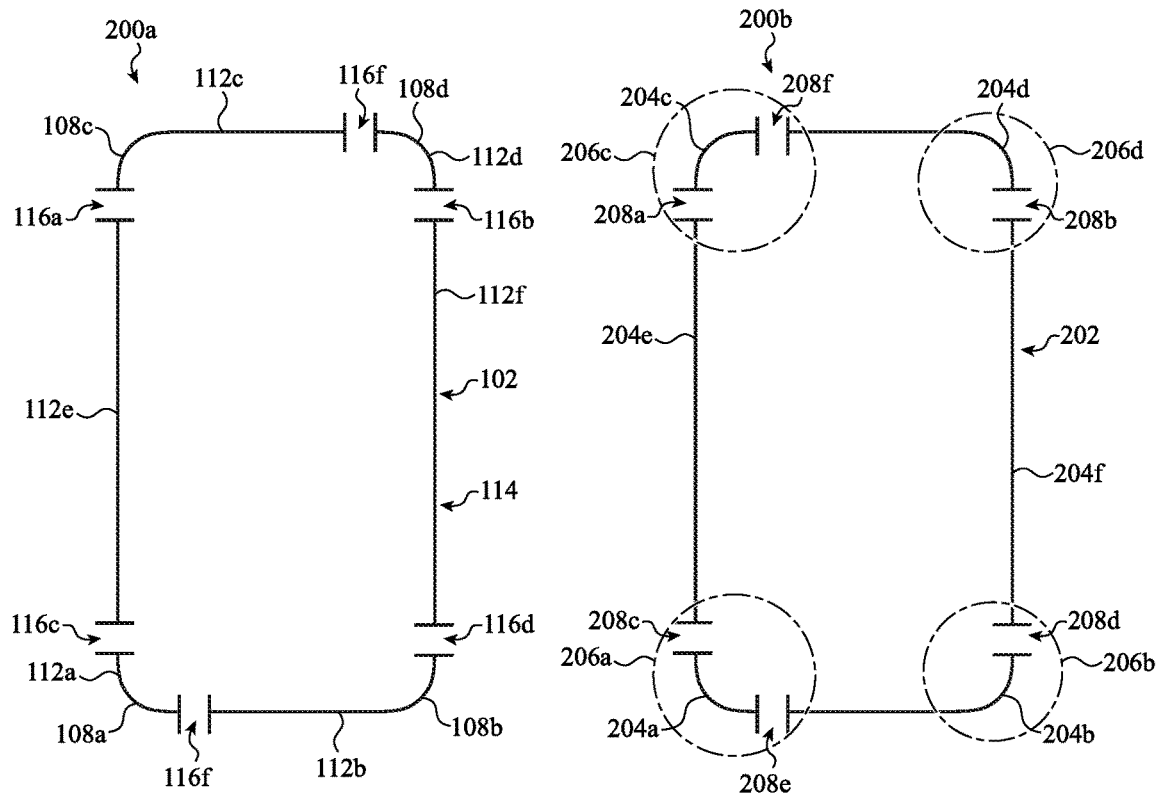
FIG. 2A  FIG. 2B
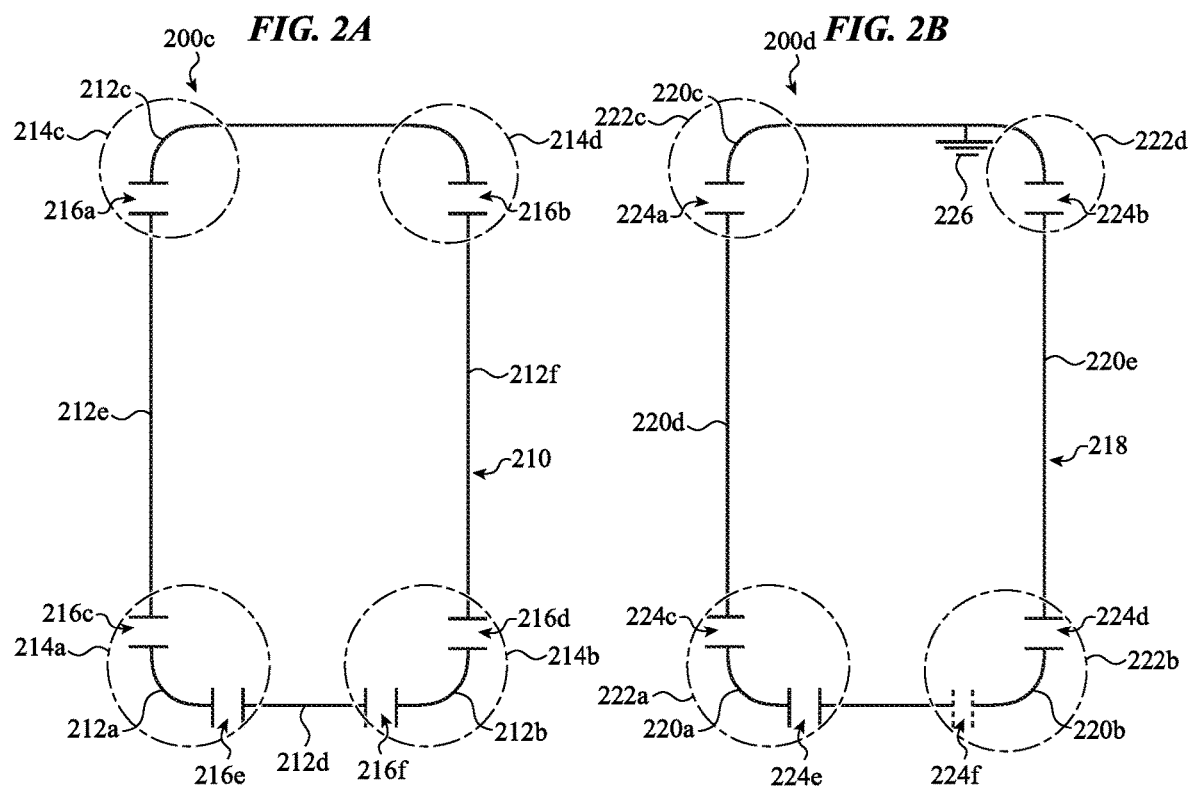
FIG. 2C  FIG. 2D

ELECTRONIC DEVICE WITH SEGMENTED HOUSING HAVING MOLDED SPLITS

CROSS-REFERENCE TO RELATED APPLICATIONS

This application is a nonprovisional patent application of, and claims the benefit to, U.S. Provisional Patent Application No. 62/725,197, filed Aug. 30, 2018 and titled "Electronic Device with Segmented Housing Having Molded Splits," and U.S. Provisional Patent Application No. 62/729,319, filed Sep. 10, 2018 and titled "Electronic Device with Segmented Housing Having Molded Splits," the disclosures of which are hereby incorporated herein by reference in their entireties.

FIELD

The described embodiments relate generally to electronic devices. More particularly, the present embodiments relate to an electronic device having a segmented enclosure with intermediate splits that are molded into place.

BACKGROUND

Portable electronic devices have become more compact over the years. There is an increasing need to make housings that are both aesthetically pleasing and structurally robust. Some traditional housings are formed from a single material in order to simplify manufacturing and assembly. However, a single piece housings may not provide some of the structural and/or aesthetic benefits of a multi-segment housing, as described herein. The devices, housings, and components and the corresponding methods of manufacturing described herein may be used to improve the manufacturability and function of multi-segment housings while maintaining the benefits of multi-segment housings.

SUMMARY

Some example embodiments are directed to multi-segment housings that include multiple conductive segments that are structurally coupled by one or more non-conductive housing segments or splits. One or more of the conductive segments may be configured to operate as an antenna and the non-conductive housing segments may provide electrical insulation between the conductive segment and one or more adjacent housing segments. As described herein, the non-conductive housing segment may be formed from a polymer having an array of fibers dispersed within. The fibers may be aligned along one or more fiber directions, which may be substantially perpendicular to an exterior surface of the housing.

Some example embodiments are directed to an electronic device having a display and a housing at least partially surrounding the display. The housing includes a first housing segment defining a first portion of an exterior sidewall of the housing and configured to operate as an antenna. The housing also includes a second housing segment defining a second portion of the exterior sidewall of the housing. The housing also includes a non-conductive housing segment mechanically coupling the first housing segment to the second housing segment, electrically insulating the first housing segment from the second housing segment, and defining a third portion of the exterior sidewall of the housing. The non-conductive housing segment is formed from or comprises a polymer material having an array of fibers that are substantially aligned along a fiber direction that is transverse to the third portion of the exterior sidewall. In some embodiments, the array of fibers are located proximate to the third portion of the exterior sidewall, and the fiber direction is substantially perpendicular to the third portion of the exterior sidewall. In some embodiments, the third portion of the exterior sidewall of the housing has a polished surface and the polished surface is substantially free of non-encapsulated fibers.

In some example embodiments, the polymer material comprises one or more of polycarbonate, acrylonitrile butadiene styrene (ABS), polyether ether ketone (PEEK), polybutylene terephthalate (PBT), or polyamide. In some example embodiments, the fiber comprises one or more of glass fiber, carbon fiber, or aramid fiber.

In some embodiments, the first housing segment includes a first interlock feature defining a first opening. The second housing segment may include a second interlock feature defining a second opening that is substantially aligned with the first opening. The polymer material of the non-conductive housing segment may at least partially fill the first opening and the second opening.

In some embodiments, the first interlock feature includes a protrusion that is positioned along an inner portion of the first housing segment and the first opening extends into the protrusion. The first interlock feature may include a first transverse opening that extends into the protrusion and intersects the first opening. The polymer material of the non-conductive housing segment may at least partially fills the first transverse opening.

In some embodiments, the first interlock feature includes a first interlock surface. The first interlock feature may include a threaded hole that extends into the first interlock surface and the threaded hole may be substantially parallel to the first opening. The polymer material of the non-conductive housing segment may at least partially fill the threaded hole.

In some example embodiments, the first housing segment defines a first interior surface and the second housing segment defines a second interior surface. The non-conductive housing segment may at least partially encapsulate the first interior surface and the second interior surface to define a waterproof seal.

Some example embodiments are directed to an electronic device having a display and a housing defining four corners that surround the display. The housing may include a first housing segment a define a first portion of an exterior surface that includes a first corner of the housing. The housing may include a second housing segment defining a second portion of the exterior surface. The housing may also include a non-conductive housing segment positioned between the first housing segment and the second housing segment and defining a third portion of the exterior surface. The non-conductive housing segment may be formed from or comprise a polymer material and an array of fibers dispersed within the polymer material. The array of fibers may be aligned along one or more directions that are substantially perpendicular to the third portion of the exterior surface.

In some example embodiments, the second housing segment defines a second corner of the housing and the housing defines a long side and a short side. The first corner and second corner may be positioned along the short side of the housing.

In some embodiments, the first housing segment and the second housing segment are operably coupled to wireless communication circuitry. The first housing segment may be operable to transmit wireless signals using a first frequency band. The second housing segment may be operable to transmit wireless signals using a second frequency band that is different than the first frequency band. In some embodiments, the wireless communication circuitry is operable to electrically couple the first housing segment to the second housing segment to transmit wireless signals using a third frequency band that is different from the first and second frequency bands.

In some embodiments, the first housing segment includes a first interlock feature defining a first opening. The second housing segment may include a second interlock feature defining a second opening that is substantially aligned with the first opening. The polymer material of the non-conductive housing segment may extend at least partially into the first opening and the second opening. In some embodiments, the first interlock feature further defines a threaded hole, and the polymer material extends at least partially into the threaded hole.

In some embodiments, the non-conductive housing segment includes a corner portion that extends along an inner portion of the first corner of the first housing segment. The corner portion may have a minimum thickness that is greater than 0.5 mm.

Some example embodiments are directed to a method of manufacturing a housing for an electronic device. A first housing segment may be positioned in a mold. The first housing segment may be formed from a first conductive material and define a first portion of an exterior surface of the housing. A second housing segment may be positioned in the mold. The second housing segment may be formed from a second conductive material and define a second portion of the exterior surface. A liquid polymer may be injected into a gap defined between the first housing segment and the second housing segment to define a non-conductive housing segment. The liquid polymer may have an array of fibers dispersed within the polymer and substantially aligned along one or more fiber directions. The liquid polymer may be cured to define a third portion of the exterior surface of the housing having the one or more fiber directions that are substantially perpendicular to the portion exterior surface of the housing.

In some embodiments, the liquid polymer is injected at an injection point that is substantially aligned with a region that corresponds to the third portion of the exterior surface of the housing.

In some embodiments, the method also includes polishing the third portion of the exterior surface using an elastomer material thereby removing exposed ends of the array of fibers. In some embodiments, the method includes polishing the third portion of the exterior surface using a laser to ablate or melt exposed ends of the array of fibers.

In some embodiments, the first housing segment includes a first interlock feature having a first opening and the second housing segment includes a second interlock feature having a second opening. The liquid polymer may be injected into the first and second openings.

BRIEF DESCRIPTION OF THE DRAWINGS

The disclosure will be readily understood by the following detailed description in conjunction with the accompanying drawings, wherein like reference numerals designate like structural elements.

FIGS. 2A-2E depict example configurations of housing segments that form a sidewall of a device.

Figure 1A:
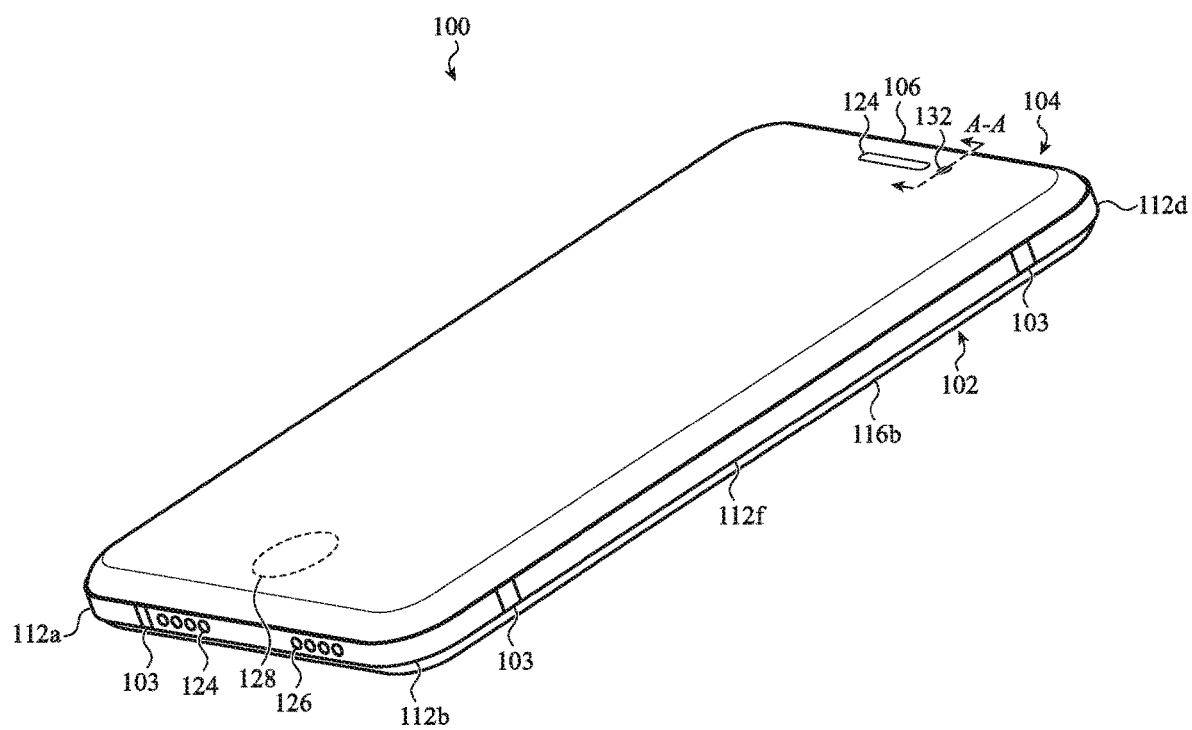
FIGS. 1A-1B depict an example electronic device.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The embodiments described herein are directed to a multi-segment housing that includes multiple conductive segments that define respective portions of a sidewall or exterior surface of the device. The multiple conductive segments are structurally coupled by one or more non-conductive housing segments that may be referred to herein as non-conductive housing segments or "splits." One or more of the conductive segments may be configured to operate as an antenna and the non-conductive housing segments may provide electrical insulation between the conductive segment and one or more adjacent housing segments. As described herein, the non-conductive housing segment may be formed from a polymer having an array of fibers dispersed within. The fibers may be aligned along one or more fiber directions, which may be substantially perpendicular to an exterior surface of the housing. The alignment of the fibers may improve the finish of exterior surface of the split while providing the structural properties required to couple the multiple segments of the housing together.

Some example embodiments are directed to systems and techniques for aligning the fibers that are encapsulated or embedded in the polymer matric or binder. In some embodiments, the fibers are aligned by a flow path of the liquid polymer as it injected into place. For example, the flow path may be along a direction that is perpendicular to an external surface of the device, which may help maintain the alignment of the fibers within the liquid polymer while being injected. In some embodiments, the pressure, viscosity of the liquid polymer, temperature of the liquid polymer, and/or the location of the injection points may be configured to align the fibers so that they are substantially perpendicular to the exterior surface defined along the sidewalls of the device.

Some example embodiments are directed to methods of manufacturing a multi-segment housing having a single-shot split or non-conductive housing segment. In particular, after molding the non-conductive housing segment, an exposed or exterior surface of the segment may be treated to provide a smooth surface finish. In some implementations, the non-conductive housing segment is formed from a polymer material having an array of fibers dispersed within the material. One or more ends of the fibers may be exposed and/or may protrude from the exposed or exterior surface of the non-conductive housing segment. In some cases, the ends of the fibers may be removed or shortened by polishing the exposed surface with an elastomer material. In some cases, the ends of the fibers may be removed or shortened by treating the exposed or exterior surface using a laser-based polishing process. For example, the ends of the fibers may be ablated or melted using a series of short laser pulses that remove exposed fibers but otherwise leave the exposed polymer material intact. In some cases, the laser also heats and reflows the exposed polymer to create a smooth or polished surface.

Some example embodiments are directed to a non-conductive housing segment that is structurally interlocked with one or more adjacent housing segments. In particular, a non-conductive housing segment may be molded into a gap between a pair of housing segments and a portion of the non-conductive portion that is located or positioned internal to the housing may flow in and around various features to provide a structural interlock. As described in more detail below, the non-conductive portion or split may be molded into one or more cavity features that are formed in an element that is internal to the housing. In some implementations, the non-conductive portion at least partially fills a threaded recess or cavity formed into an adjacent housing section.

As described in more detail below, one or more of the housing segments may be formed from a conductive material and may be configured to function as an antenna for the electronic device. In particular, one or more housing segments may be operably coupled to wireless communication circuitry and may be configured to transmit and receive wireless communication signals. In some cases, separate otherwise distinct housing segments define the four corners of the device or housing. Each distinct housing segment may be configured to operate as an antenna in order to facilitate multi-band wireless communication.

These and other embodiments are discussed below with reference to FIGS. 1-10. However, those skilled in the art will readily appreciate that the detailed description given herein with respect to these Figures is for explanatory purposes only and should not be construed as limiting.

Directional terminology, such as "top", "bottom", "upper", "lower", "front", "back", "over", "under", "left", "right", etc. is used with reference to the orientation of some of the components in some of the figures described below. Because components in various embodiments can be positioned in a number of different orientations, directional terminology is used for purposes of illustration only and is in no way limiting. The directional terminology is intended to be construed broadly, and therefore should not be interpreted to preclude components being oriented in different ways.

Figure 1B:
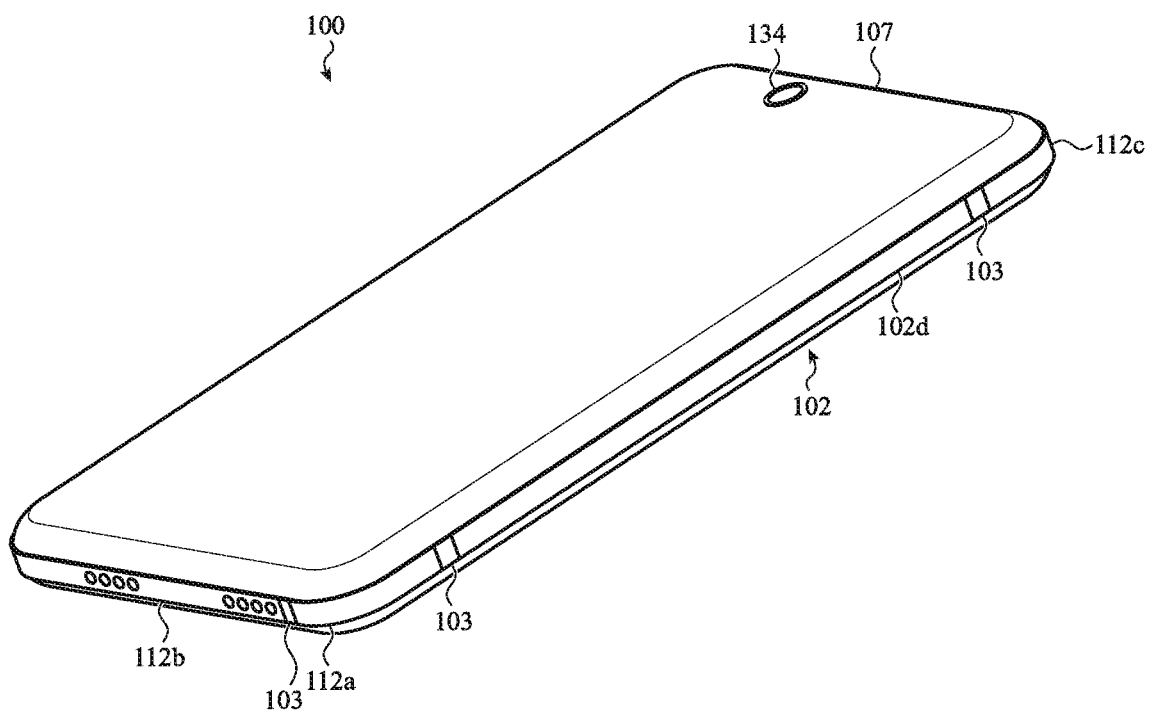
Figure 1C:
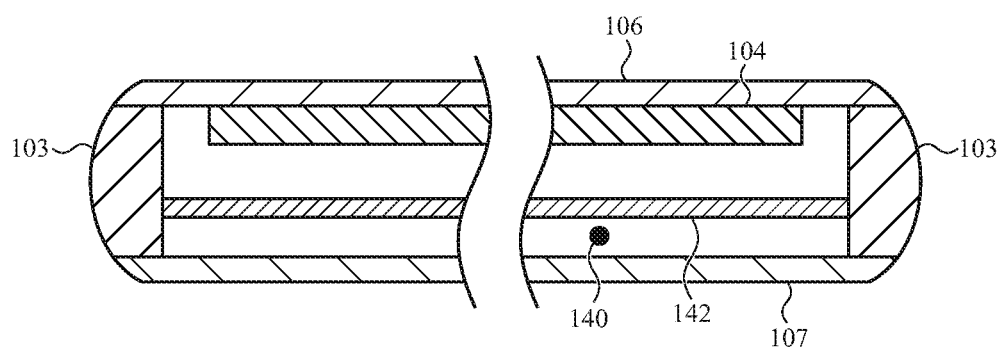
FIG. 1C depicts an example cross-sectional view of the device of FIGS. 1A and 1B taken along section A-A.

FIGS. 1A-1C show an example of an electronic device or simply "device" 100. The device's dimensions and form factor, including the ratio of the length of its long sides to the length of its short sides, correspond to the mobile phone or smartphone form factor of the device 100. For purposes of this disclosure, the device 100 may be a portable electronic device including, for example a mobile phone, tablet computer, portable computer, portable music player, health monitor device, portable terminal, or other portable or mobile device. FIG. 1A shows a front isometric view of the device 100, FIG. 1B shows a rear isometric view of the device 100, and FIG. 1C shows a cross-section of the device 100. The device 100 may include a housing 102 that at least partially surrounds a display 104. The housing 102 may include or support a cover 106. The cover 106 may be positioned over the display 104, and may provide a window through which the display may be viewed. In some embodiments, the display 104 may be attached to (or abut) the housing 102 and/or the cover 106.

As shown in FIGS. 1A and 1B, the housing 102 may define four corners that surround the display 104. A corner of the device 100 may correspond to a region or portion of the housing in which one side (e.g., a long side) transitions to another side (e.g., a short side). The corner of the device may include some or all of the curved region and a portion of the adjoining side. In the current example, each of the four corners of the housing is positioned along a respective corner of the rectangular display 104 and define respective portions of the exterior surface of the device 100. The relative position of the corners may vary depending on the implementation. The corners are shown to be rounded in FIGS. 1A & 1B, but may alternatively be square or have another profile shape (e.g., a squared or angled corner). In this example, the housing 102 has a generally rectangular shape having a length dimension that is greater than a width dimension. In some cases the length is greater than 100 mm and the width is greater than 50 mm. The housing 102 may also have a thickness that ranges between 5 mm and 15 mm.

In some cases, the housing 102 may be a multi-segment housing that includes multiple conductive or metal segments that are separated by one or more non-conductive housing segments. In some cases the multi-segment housing includes a support plate and/or additional internal structural components that are used to support internal electronic circuitry or electronic components.

The housing segments of the housing 102 may define or form part or all of an exterior sidewall (also referred to herein as a sidewall). In particular, the housing segments may define portions side surface (e.g., portions of an exterior side surface) of the device 100, which may include four corners of the sidewall. As shown in FIGS. 1A and 1B, the housing segments or sidewall may at least partially surround a perimeter the display, and in some cases may be configured to protect the display from drops of the device that involve an impact to an edge or corner of the sidewall. By way of example, the housing 102 may include four housing segments 112a, 112b, 112c, 112d, 112e, 112f that are mechanically coupled to other portions of the housing by one or more non-conductive housing segments 103.

As used herein, the term "corner" may be used to refer to a portion of an exterior surface or sidewall of a device that forms a transition between adjoining sides or sidewalls. The corner may refer to a region that includes 3-dimensional (3D) structure(s) that include portions of the sidewalls and/or portions of the front or rear covers 106, 107 defining the front and rear surfaces, respectively. The term "corner" may also be used to refer to a portion of a sidewall 114 that extends (linearly or non-linearly) between the front and rear surfaces of a device and also joins adjacent sidewalls. In some embodiments, the corner portion of a sidewall may define a curved or arcuate contour between the front and rear surfaces. In some embodiments, the corner portion of a sidewall may define a flat side that joins the front and rear surfaces. As described herein, a generally rectangular device may be considered to have four corners that define the perimeters of the front and rear surfaces of the device with each corner connected to two adjacent corners. A generally rectangular device may also be considered to have four corners joined by four sides, with the four corners, in combination with the four sides, defining the perimeters of the front and rear surfaces of the device.

As explained in more detail herein, one or more of the housing segments may be mechanically or structurally coupled to one or more adjacent housing segments by the non-conductive housing segments that may partially or completely fill a gap between the housing segments. In some cases, the non-conductive housing segment or segments may also couple the housing segments to a support plate or other internal structure. A contiguous piece of non-conductive material (e.g., a monolithic non-conductive housing segment) may join all or multiple ones of the housing segments (or fill all or multiple ones of the gaps between housing segments), or different pieces of non-conductive material may join different sets of adjacent housing segments (or fill different gaps between different pairs of adjacent housing segments). At least one non-conductive housing segment in the set of non-conductive housing segments may define a portion of an exterior surface of the housing. In alternative embodiments, the housing may include more or fewer housing segments separated by more or fewer gaps filled with non-conductive housing segment(s). In addition to mechanically coupling housing segments, the non-conductive housing segment(s) may electrically isolate housing segments.

The housing segments 112a, 112b, 112c, 112d, 112e, 112f, 103 may have various lengths or shapes, and may be positioned symmetrically or asymmetrically about the device 100 or its sidewall. By way of example, the device 100 is shown to have a first housing segment 112a defining at least part (or all) of a first corner of the sidewall. A second housing segment 112b defines at least part (or all) of a second corner of the sidewall and the first and second housing segments 112a and 112b extend along a (lower) short side of the housing 102. A third housing segment 112c defines least part (or all) of a third corner of the sidewall. A fourth housing segment 112d defines at least part (or all) of a fourth corner of the sidewall and the third and fourth housing segments 112c and 112d extend along an (upper) short side of the housing 102. A fifth housing segment 112e extends between the first housing segment 112a and the third housing segment 112c. Similarly, a sixth housing segment 112f extends between the second housing segment 112b and the fourth housing segment 102d. The third corner forms a part of the housing that is diagonally opposite the second corner, and the fourth corner forms a part of the housing that is diagonally opposite the first corner. The designations "first," "second," "third," and "fourth" are arbitrary, and are used herein only for ease of explanation.

In this example, a two housing segments (112a, 112b) forms a pair of lower or bottom corners and another set of housing segments (112c, 112d) forms a pair of upper or top corners. However, the specific configuration may vary depending on the implementation. For example, a single housing segment may form both lower or bottom corners and another single housing segment may form both upper or top corners. By way of further example, as shown in FIGS. 2A-2E, the segmented housing may have a variety of different configurations of housing segments. Further, while the housing 102 depicts a substantially straight or non-corner segments 112e and 112f formed along the left and right sides of the housing 102, in another embodiment, similar straight or non-corner segments may extend along the top and/or bottom sides of the housing. Various combinations of these optional permutations are possible.

In some embodiments, one or more of the housing segments 112a, 112b, 112c, 112d, 112e, 112f may be a conductive segment formed from a metal or conductive material, and may be configured to operate as an antenna for the device. Housing segments that are configured to be operated as an antenna may sometimes be referred to herein as conductive antenna segments. Wireless communication circuitry within the device may be electrically coupled to one or more of the conductive segments. For example, wireless communication circuitry may be coupled to one or more (or each) of the (conductive) housing segments 112a, 112b, 112c, 112d, 112e, 112f that is conductive and is configured to operate as an antenna. As discussed in more detail below with respect to FIGS. 2A-2E, when multiple housing segments are formed from a conductive material and are configured to operate as antennas for the device 100, the wireless communication circuitry may enable the device 100 to communicate wirelessly with external devices or systems using one or more wireless frequency bands. In some cases, the device 100 may be configured to operate in one or more wireless communication modes including, for example, a 4×4 MIMO wireless communication mode, or in other wireless communication modes that use more than one antenna, and up to four antennas, simultaneously. The wireless communication circuitry may include one or more radio frequency (RF) transmitters or receivers, one or more modems, and so on.

In general, the housing segments 112a, 112b, 112c, 112d, 112e, 112f may be formed from a metal material including, for example, steel, stainless steel, aluminum, titanium, and/or a metal alloy. In some embodiments, the housing segments 112a, 112b, 112c, 112d, 112e, 112f are formed from a non-metal material and are coated or covered by a metal or metallic coating or layer. The non-conductive housing segments 103 may be formed from a polymer, composite, or other non-conductive material. Example polymers include, polycarbonate, acrylonitrile butadiene styrene (ABS), polyurethane, polyether ether ketone (PEEK), polybutylene terephthalate (PBT), polyamide, or other similar materials. As discussed herein, the non-conductive housing segments 103 may include a polymer matrix or binder that encapsulates an array of fibers. The array of fibers may include, without limitation, glass fibers (e.g., fiberglass), carbon fibers, metal nanowire, aramid fiber, and/or other fiber or wire (e.g., nanowire) materials.

In some embodiments, the non-conductive housing segments or components 103 may be formed by a polymer material having a fiber fill, and the polymer material may structurally couple the housing segments in addition to forming portions of an exterior surface of the sidewall (e.g., portions of the sidewall that bridge or fill exterior gaps between housing segments). In some embodiments, the non-conductive housing segments or components 103 may include a first portion formed from a first polymer material and a second portion formed from a second polymer material. The first polymer material may have a fiber fill and structurally couple the housing segments. The second polymer material may be different from the first polymer material and form portions of an exterior surface of the sidewall. Each polymer having a fiber fill may have a fiber fill including glass or other types of fibers, as described above. In some embodiments, the second polymer material may also have a fiber fill, but have a fiber fill that differs from the fiber fill of the first polymer material.

As shown in FIGS. 1A and 1B, the device 100 may include various other components. For example, the device 100 may include one or more speakers 122, 124, microphones 126 or other audio components that are configured to transmit or receive audio signals. The device 100 may also include various input devices including button 128, which may be located along the front face of the device 100. The device 100 may also include other buttons positioned along the sidewalls of the device 100 and/or rear surface of the device 100.

As discussed previously, the device 100 includes a display 104 that is at least partially surrounded by the housing 102. The display 104 may include one or more display elements including, for example, a light-emitting display (LED), organic light-emitting display (OLED), liquid crystal display (LCD), electroluminescent display (EL), or other type of display element. The display 104 may also include one or more touch and/or force sensors that are configured to detect a touch and/or a force applied to an exterior surface of the device 100. The touch sensor may include a capacitive array of nodes or elements that are configured to detect a location of a touch along a surface of the cover 106. The force sensor may include a capacitive and/or strain sensor that is configured to detect an amount of force allowed along the surface of the cover 106.

As shown in FIG. 1A, the front of the device may include a front-facing camera 132, light detector, or other optical sensor. In some cases, the front-facing camera 132 alone or in combination with other sensors may be configured to operate as a bio-authentication or facial recognition sensor. As shown in FIG. 1B, a camera 134 or other optical sensor may be positioned along the rear of the device 100. A flash or light source may also be positioned along the rear of the device.

FIG. 1C depicts a cross-sectional view of the device 100 of FIGS. 1A and 1B. As shown in FIG. 1C, the housing 102 includes one or more non-conductive housing segments 103 that structurally couple the housing segments (112a, 112b, 112c, 112d, 112e, 112f of FIGS. 1A and 1B). The housing 102 also includes front cover 106 and rear cover 107, which may be structurally coupled to the non-conductive housing segments 103 and/or one or more of the housing segments (112a, 112b, 112c, 112d, 112e, 112f of FIGS. 1A and 1B). In some cases, the rear cover 107 is a discrete or separate component that is attached to the non-conductive housing segments 103 and/or one or more of the housing segments (112a, 112b, 112c, 112d, 112e, 112f). In other cases, the rear cover 107 is integrally formed with one or more of the housing segments (e.g., 112e, 112f) to form a component that defines both the rear surface of the device 100 as well as one or more sidewalls of the device 100.

As shown in FIG. 1C, the housing 102 defines an internal volume 140 in which the various electronic components of the device 100 may be positioned. In this example, the display 104 is at least partially positioned within the internal volume 140 and is attached to a rear surface of the cover 106. A touch sensor, force sensor, or other sensing element may be integrated with the cover 106 and/or the display 104 and may be configured to detect a touch and/or a force applied to a surface of the cover 106. In some cases, the touch sensor, force sensor, and/or other sensing element may be positioned between the cover 106 and the display 104.

The touch sensor and/or force sensor may include an array of electrodes that are configured to detect a location and/or force of a touch using a capacitive, resistive, strain-based, or other sensing configuration. The touch sensing system may include, for example, a set of capacitive touch sensing elements, a set of resistive touch sensing elements, or a set of ultrasonic touch sensing elements. When a user of the device touches the cover, the touch sensor (or touch sensing system) may detect one or more touches on the cover and determine locations of the touches on the cover. The touches may include, for example, touches by a user's finger or stylus. A force sensor or force sensing system may include, for example, a set of capacitive force sensing elements, a set of resistive force sensing elements, or one or more pressure transducers. When a user of the device 100 presses on the cover (e.g., applies a force to the cover 106), the force sensing system may determine an amount of force applied to the cover. In some embodiments, the force sensor (or force sensing system) may be used alone or in combination with the touch sensor (or touch sensing system) to determine a location of an applied force, or an amount of force associated with each touch in a set of multiple contemporaneous touches.

As shown in FIG. 1C, a support plate 142 may be coupled to the non-conductive housing segments 103 and/or one or more of the housing segments (112a, 112b, 112c, 112d, 112e, 112f) and may be used to attach or mount various other components of the device 100. For example, wireless communication circuitry, a camera(s), a bio-authentication sensor(s), a processor, and other components may be attached to the support plate 142. In some cases, the various electronic components are attached or integrated with one or more printed circuit boards that are attached to the support plate 142. The processor may include a single processor or multiple processors, and may be configured to operate the touch sensing system, the force sensing system, the wireless communication circuitry, the camera(s), the bio-authentication sensor(s), or other components of the device. A more detailed description of the various components of the device 100 is included below with respect to FIG. 10.

Turning to FIGS. 2A-2e, there are shown a number of different configurations 200 for the housing segments that form a sidewall of a device (e.g., a device such as the device 100 described with reference to FIGS. 1A-1C). One or more conductive segments of the multi-segment housings may be configured to operate as antennas for the device.

FIG. 2A shows a first sidewall configuration 200a for a device (e.g., the device 100). The sidewall 114 may include six housing segments, which housing segments may be the housing segments 112 described with reference to FIGS. 1A-1C. Each of the housing segments 112 may be conductive or non-conductive. In some embodiments, at least one of the housing segments 112 positioned at a corner 108 of the sidewall 114 may be conductive and operated as an antenna for a device. In some embodiments, each of the housing segments 112 positioned at a corner 108 of the sidewall 114 may be conductive, and may be operated as an antenna for a device. The housing segments 112 positioned at the left and right edges of the sidewall 114 may also be conductive, and may be operated as separate antennas of a device, or as conductive antenna segments that may be electrically connected or disconnected to other conductive antenna segments of a device.

The housing segments 112 may include a first housing segment 112a defining at least part (or all) of a first corner 108a of the sidewall 114, a second housing segment 112b defining at least part (or all) of a second corner 108b of the sidewall 114, a third housing segment 112c defining at least part (or all) of a third corner 108c of the sidewall 114, a fourth housing segment 112d defining at least part (or all) of a fourth corner 108d of the sidewall 114, a fifth housing segment 112e defining an edge disposed between the first and third housing segments 112a, and a sixth housing segment 112f defining an edge disposed between the second and fourth housing segments 112b, 112d. The third corner 108c forms a part of the housing 102 that is diagonally opposite the second corner 108b, and the fourth corner 108d forms a part of the housing 102 that is diagonally opposite the first corner 108a. In some embodiments, and as shown, each of the second and third housing segments 112b, 112c may extend along a greater portion of the sidewall 114 than each of the first and fourth housing segments 112a, 112d.

The first and fourth housing segments 112a, 112d may be substantially confined to the first and fourth corners 108a, 108d respectively, but in some embodiments (not shown) one or both of the first or fourth housing segments 112a, 112d may extend along one or more edges of the sidewall 114. Alternatively, the first or fourth housing segment 112a, 112d may wrap around less than all of a corner 108a or 108d of the sidewall 114.

The second and third housing segments 112b, 112c may wrap around the second and third corners 108b, 108c respectively, and may also extend along one or more edges of the sidewall 114. For example, the second housing segment 112b may extend along a bottom edge of the sidewall 114 (given the orientation of the sidewall 114 shown in FIG. 2A), and the third housing segment 112c may extend along a top edge of the sidewall 114. Alternatively, the second or third housing segment 112b, 112c may wrap around less than all of a corner 108b or 108c of the sidewall 114 and extend along one or more side edges of the sidewall 114.

Housing segments 112 that terminate in adjacent ends along the sidewall 114 may be structurally coupled to one another by a set of one or more non-conductive housing segments 116. The non-conductive housing segments 116 may also be referred to herein as non-conductive housing components. In the current example, the non-conductive housing segments, 116a, 116b, 116c, 116d, 116e, and 116f partially or completely fill gaps between adjacent ends of housing segments 112 about the sidewall 114. The sidewall 114 shown in FIG. 2A has six such gaps. At least one non-conductive housing segment 116 in the set of non-conductive housing segments 116 may define a portion of an exterior surface of the sidewall 114 (and also an exterior surface of the housing 102 that includes the sidewall 114).

In some embodiments, each of the housing segments 112a, 112b, 112c, 112d positioned at a corner 108a, 108b, 108c, 108d of the sidewall 114 may be operated as a different antenna, and in some cases the housing segments 112a, 112b, 112c, 112d may be operated as different antennas simultaneously. The housing segments 112 may also be operated as antennas individually or in pairs, as may be useful for different wireless communication modes. In some examples, the first and fourth housing segments 112a, 112d may be used to communicate, individually or in parallel, over a same wireless frequency band or bands (e.g., the mid and high wireless frequency bands described with reference to FIG. 11), and the second and third housing segments 112b, 112c may be used to communicate, individually or in parallel, over a different set of one or more wireless frequency bands (e.g., the low, mid, and high wireless frequency bands described with reference to FIG. 11). The use of housing segments positioned at diagonally opposite corners of the sidewall 114 as antennas that communicate over the same wireless frequency band(s) provides a relatively maximum spatial separation between the antennas, such that the antennas are less likely to couple to one another.

Optionally, the fifth housing segment 112e may be connected or disconnected to one of the corner housing segments (e.g., to the first housing segment 112a or the third housing segment 112c) by a circuit disposed interior to a housing including the sidewall 114, or the sixth housing segment 112f may be connected or disconnected to one of the corner housing segments (e.g., to the second housing segment 112b or the fourth housing segment 112d) by a circuit disposed interior to the housing including the sidewall 114. Such switchable connections enable the housing segments 112 defining the sidewall 114 to be tuned to communicate over different wireless frequency bands.

FIG. 2B shows another sidewall configuration 200b for a device (e.g., the device 100). The sidewall 202 may include six housing segments 204. As an example, the housing segments 204 may include a first housing segment 204a defining at least part (or all) of a first corner 206a of the sidewall 202, a second housing segment 204b defining at least part (or all) of a second corner 206b of the sidewall 202, a third housing segment 204c defining at least part (or all) of a third corner 206c of the sidewall 202, a fourth housing segment 204d defining at least part (or all) of a fourth corner 206d of the sidewall 202, a fifth housing segment 204e defining an edge disposed between the first and third housing segments 204a, 204c, and a sixth housing segment 204f defining an edge disposed between the second and fourth housing segments 204b, 204d. The third corner 206c forms a part of the housing 202 that is diagonally opposite the second corner 206b, and the fourth corner 206d forms a part of the housing 202 that is diagonally opposite the first corner 206a.

Housing segments 204 that terminate in adjacent ends along the sidewall 202 may be structurally coupled to one another by a set of one or more non-conductive housing segments 208 (e.g., non-conductive housing segments, 208a, 208b, 208c, 208d, 208e, and 208f) that partially or completely fill gaps between adjacent ends of housing segments 204 about the sidewall 202. The sidewall 202 shown in FIG. 2B has six such gaps. At least one non-conductive housing segment 208 in the set of non-conductive housing segments 208 may define a portion (e.g., a segment) of an exterior surface of the sidewall 202 (and also an exterior surface of the housing that includes the sidewall 202). In some embodiments, the non-conductive housing segments 208 may be variously configured and positioned, or formed of various materials, as described with reference to FIGS. 1A-1C.

The sidewall 202 and housing segments 204 may be formed, structurally coupled, and electrically insulated similarly to the sidewall 114 and housing segments 112 described with reference to FIG. 2A. However, the gap between the third and fourth housing segments 112c, 112d in FIG. 2A may be moved to the left along the top of the sidewall 202, such that the third housing segment 204c may be substantially confined to the third corner 206c, and the fourth housing segment 204d may wrap around the fourth corner 206d and extend along the top edge of the sidewall 202 (that is, along the top edge of the sidewall 202 given the orientation of the sidewall 202 shown in FIG. 2B). In alternative embodiments (not shown), the third housing segment 204c may also extend along one or more side edges of the sidewall 202, or may wrap around less than all of the third corner; or the fourth housing segment 204d may wrap around less than all of the fourth corner 206d.

In some embodiments, each of the housing segments 204a, 204b, 204c, 204d positioned at a corner 206 of the sidewall 202 may be operated as a different antenna, and in some cases the housing segments 204a, 204b, 204c, 204d may be operated as different antennas simultaneously. The housing segments 204a, 204b, 204c, 204d may also be operated individually or in pairs, as may be useful for different wireless communication modes. In some examples, the first and third housing segments 204a, 204c may be used to communicate, individually or in parallel, over a same wireless frequency band or bands (e.g., the mid and high wireless frequency bands described with reference to FIG. 11), and the second and fourth housing segments 204b, 204c may be used to communicate, individually or in parallel, over a different set of one or more wireless frequency bands (e.g., the low, mid, and high wireless frequency bands described with reference to FIG. 11).

Optionally, the fifth housing segment 204e may be connected or disconnected to one of the corner housing segments (e.g., to the first housing segment 204a or the third housing segment 204c) by a circuit disposed interior to a housing including the sidewall 202, or the sixth housing segment 204f may be connected or disconnected to one of the corner housing segments (e.g., to the second housing segment 204b or the fourth housing segment 204d) by a circuit disposed interior to the housing including the sidewall 202. Such switchable connections enable the housing segments 204 defining the sidewall 202 to be tuned to communicate over different wireless frequency bands.

FIG. 2C shows another sidewall configuration 200c for a device (e.g., the device 100). The sidewall 210 includes six housing segments 214. The sidewall 210 and housing segments 212 may be formed, structurally coupled, and electrically insulated similarly to the sidewall 114 and housing segments 112 described with reference to FIG. 2A. However, the manner in which the sidewall 210 is divided between the housing segments 212 differs, such that three housing segments 212a, 212b, 212d are positioned near the bottom edge of the sidewall 210 (given the orientation of the sidewall 210 shown in FIG. 2C), and a single housing segment 212c is positioned near a top edge of the sidewall 210. Alternatively, three housing segments may be positioned near the top edge of the sidewall 210, and a single housing segment may be positioned near the bottom edge of the sidewall 210.

The housing segments 212 may include a first housing segment 212a defining at least part (or all) of a first corner 214a of the sidewall 210, a second housing segment 212b defining at least part (or all) of a second corner 214b of the sidewall 210, a third housing segment 212c defining at least parts (or all) of third and fourth adjacent corners 214c, 214d of the sidewall 210 and a first edge of the sidewall 210 disposed between the third and fourth corners 214c, 214d, a fourth housing segment 212d defining at least part of a second edge opposite the first edge, a fifth housing segment 212e defining an edge disposed between the first and third housing segments 212a, 212c, and a sixth housing segment 212f defining an edge disposed between the second and third housing segments 212b, 212c.

The first and second housing segments 212a, 212b may be substantially confined to the first and second corners 214a, 214b respectively, but in some embodiments (not shown) one or both of the first or second housing segments 212a, 212b may extend along one or more side edges of the sidewall 210. Alternatively, the first or second housing segment 212a, 212b may wrap around less than all of a corner of the sidewall 210.

Housing segments 212 that terminate in adjacent ends along the sidewall 210 may be structurally coupled to one another by a set of one or more non-conductive housing segments 214 (e.g., non-conductive housing segments, 216a, 216b, 216c, 216d, 216e, and 216f) that partially or completely fill gaps between adjacent ends of housing segments 212 about the sidewall 210. The sidewall 210 shown in FIG. 2C has six such gaps. At least one non-conductive housing segment 216 in the set of non-conductive housing segments 216 may define a portion (e.g., a segment) of an exterior surface of the sidewall 210 (and also an exterior surface of the housing that includes the sidewall 210). In some embodiments, the non-conductive housing segments 216 may be variously configured and positioned, or formed of various materials, as described with reference to FIGS. 1A-1C.

The sidewall 210 and housing segments 212 may be formed, structurally coupled, and electrically insulated similarly to the sidewall 202 and housing segments 204 described with reference to FIG. 2A.

In some embodiments, each of the first, second, third, and fourth housing segments 212a, 212b, 212c, 212d may be operated as a different antenna, and in some cases the housing segments 212a, 212b, 212c, 212d may be operated as different antennas simultaneously. The housing segments 212a, 212b, 212c, 212d may also be operated individually or in pairs, as may be useful for different wireless communication modes. In some examples, the first and second housing segments 212a, 212b may be used to communicate, individually or in parallel, over a same wireless frequency band or bands (e.g., the mid and high wireless frequency bands described with reference to FIG. 11), and the third and fourth housing segments 212c, 212d may be used to communicate, individually or in parallel, over a different set of one or more wireless frequency bands (e.g., the low, mid, and high wireless frequency bands described with reference to FIG. 11).

Optionally, the fifth housing segment 212e may be connected or disconnected to one of the corner housing segments (e.g., to the first housing segment 212a or the third housing segment 212c) by a circuit disposed interior to a housing including the sidewall 210, or the sixth housing segment 212f may be connected or disconnected to one of the corner housing segments (e.g., to the second housing segment 212b or the third housing segment 212c) by a circuit disposed interior to the housing including the sidewall 210. Such switchable connections enable the housing segments 212 defining the sidewall 210 to be tuned to communicate over different wireless frequency bands.

FIG. 2D shows a sidewall configuration 200d for a device (e.g., the device 100). The sidewall 218 includes five housing segments 220. The housing segments 220 may include a first housing segment 220a defining at least part (or all) of a first corner 222a of the sidewall 218, a second housing segment 220b defining at least part (or all) of a second corner 222b of the sidewall 218, a third housing segment 220c defining at least parts (or all) of third and fourth adjacent corners 222c, 222d of the sidewall 218 and a first edge of the sidewall 218 disposed between the third and fourth corners 222c, 222d, a fourth housing segment 220d defining an edge disposed between the first and third housing segments 220a, 220c, and a fifth housing segment 220e defining an edge disposed between the second and third housing segments 220b, 220c.

Housing segments 220 that terminate in adjacent ends along the sidewall 218 may be structurally coupled to one another by a set of one or more non-conductive housing segments 224 (e.g., non-conductive housing segments, 224a, 224b, 224c, 224d, and 224e) that partially or completely fill gaps between adjacent ends of housing segments 220 about the sidewall 218. The sidewall 218 shown in FIG. 2D has five such gaps. At least one non-conductive housing segment 224 in the set of non-conductive housing segments 224 may define a portion (e.g., a segment) of an exterior surface of the sidewall 218 (and also an exterior surface of the housing that includes the sidewall 218). In some embodiments, the non-conductive housing segments 224 may be variously configured and positioned, or formed of various materials, as described with reference to FIGS. 1A-1C.

The sidewall 218 and housing segments 220 may be formed, structurally coupled, and electrically insulated similarly to the sidewall 114 and housing segments 112 described with reference to FIG. 2A. However, the third and fourth housing segments 112c, 112d shown in FIG. 2A are replaced with a singular housing segment 220c having a ground connection 226 where the gap between the third and fourth housing segments 112c, 112d is shown in FIG. 2A. The ground connection 226 provides separation between left and right portions of the housing segment 220c and enables the left and right portions to be operated as different antennas (e.g., similarly to the third and fourth segments 112c, 112d described with reference to FIG. 2A).

In some embodiments of the sidewall 218, a portion of the second housing segment 220b may be removed and filled with a non-conductive material 224f to provide an apparent symmetry between the lower left and lower right portions of the sidewall 218.

Figure 2E:
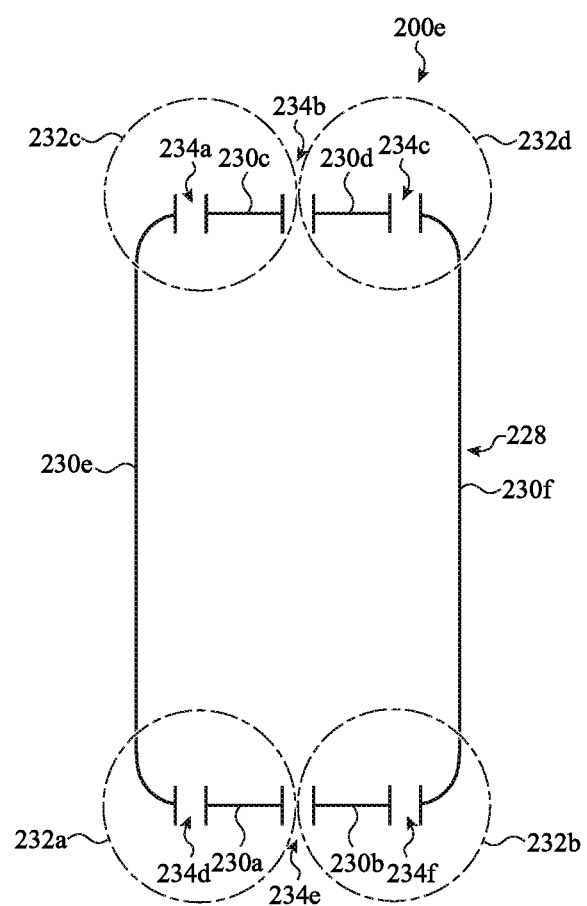

FIG. 2E shows a sidewall configuration 200e for a device (e.g., the device 100). The sidewall 228 includes six housing segments 230. The housing segments 230 may include a first housing segment 230a positioned near a first corner 232a of the sidewall 228, a second housing segment 230b positioned near a second corner 232b of the sidewall 228, a third housing segment 230c positioned near a third corner 232s of the sidewall 228, a fourth housing segment 230d positioned near a fourth corner 232d of the sidewall 228, a fifth housing segment 230e defining a first edge of the sidewall 228 and disposed between the first and third corners 232a, 232c, and a sixth housing segment 230f defining a second edge of the sidewall 228 and disposed between the second and fourth corners 232b, 232d.

Housing segments 230 that terminate in adjacent ends along the sidewall 228 may be structurally coupled to one another by a set of one or more non-conductive housing components 234 (e.g., non-conductive housing components, 234a, 234b, 234c, 234d, 234e, and 2340 that partially or completely fill gaps between adjacent ends of housing segments 230 about the sidewall 228. The sidewall 228 shown in FIG. 2E has six such gaps. At least one non-conductive housing component 234 in the set of non-conductive housing components 234 may define a portion (e.g., a segment) of an exterior surface of the sidewall 228 (and also an exterior surface of the housing that includes the sidewall 228). In some embodiments, the non-conductive housing components 234 may be variously configured and positioned, or formed of various materials, as described with reference to FIGS. 1A-1C.

The sidewall 228 and housing segments 230 may be formed, structurally coupled, and electrically insulated similarly to the sidewall 114 and housing segments 112 described with reference to FIG. 2A.

In each of the sidewall configurations 200a-e described with reference to FIGS. 2A-2E, housing segments 112, 204, 212, 220, or 230 that are configured to be operated as primary antennas for a device may be positioned at the corners or top and bottom edges of a device's sidewall 114, 202, 210, 218, or 228. Such a placement of antennas may be useful in that the antennas are positioned away from the sidewall edges that would normally be gripped by a user of a device that includes the sidewall. Housing segments 112, 204, 212, 220, or 230 that are configured to be operated in pairs, in a same wireless frequency band, may be positioned at opposite corners or opposite extents of the sidewalls 114, 202, 210, 218, or 228.

Figure 3A:
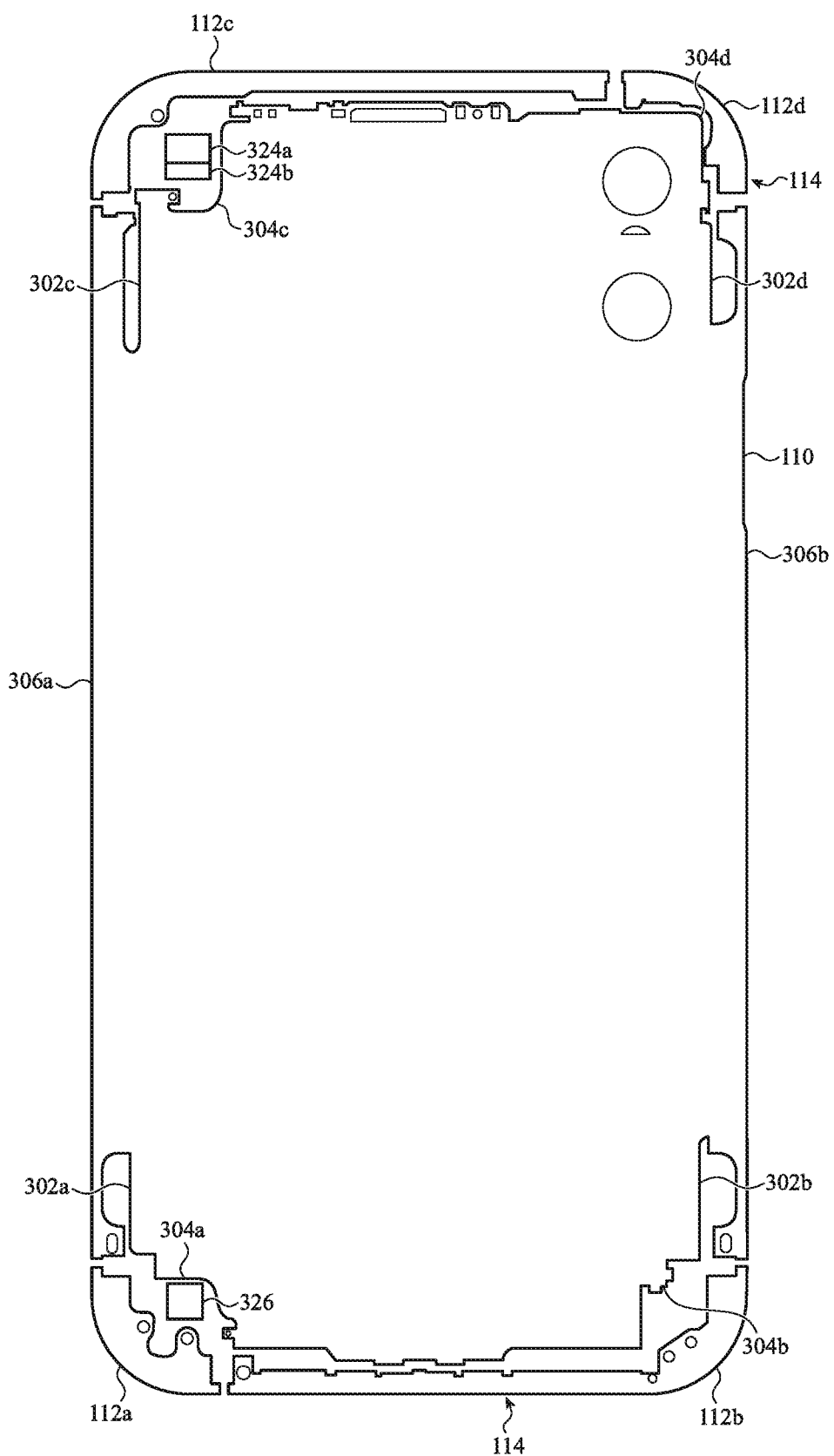
FIGS. 3A-3C depict an example implementation of a multi-segment housing.
Figure 3B:
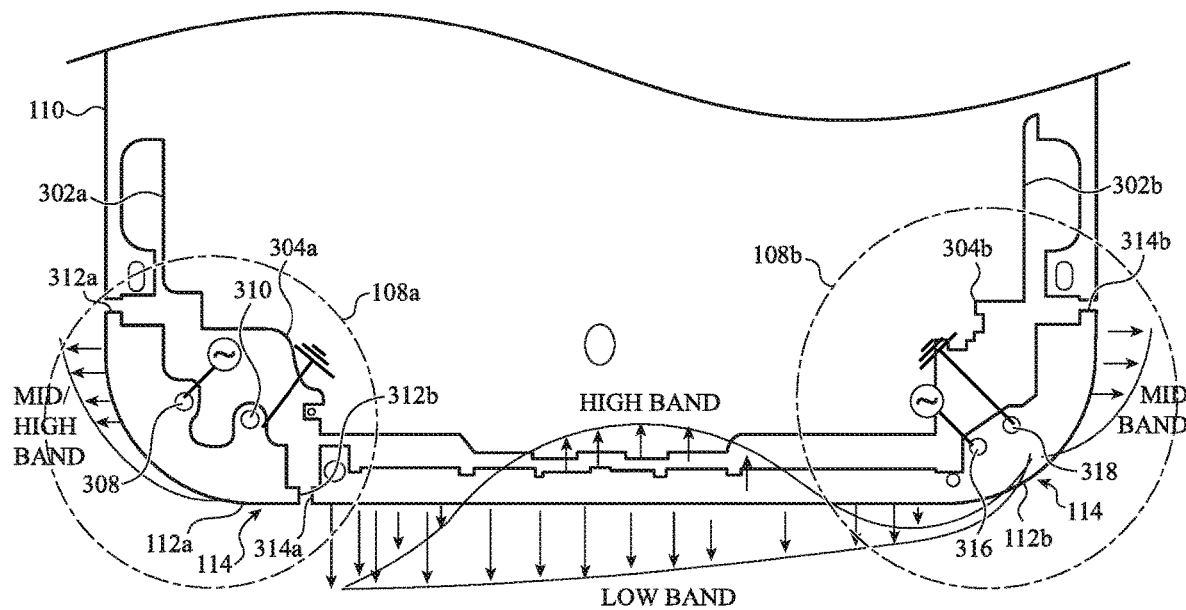
Figure 3C:
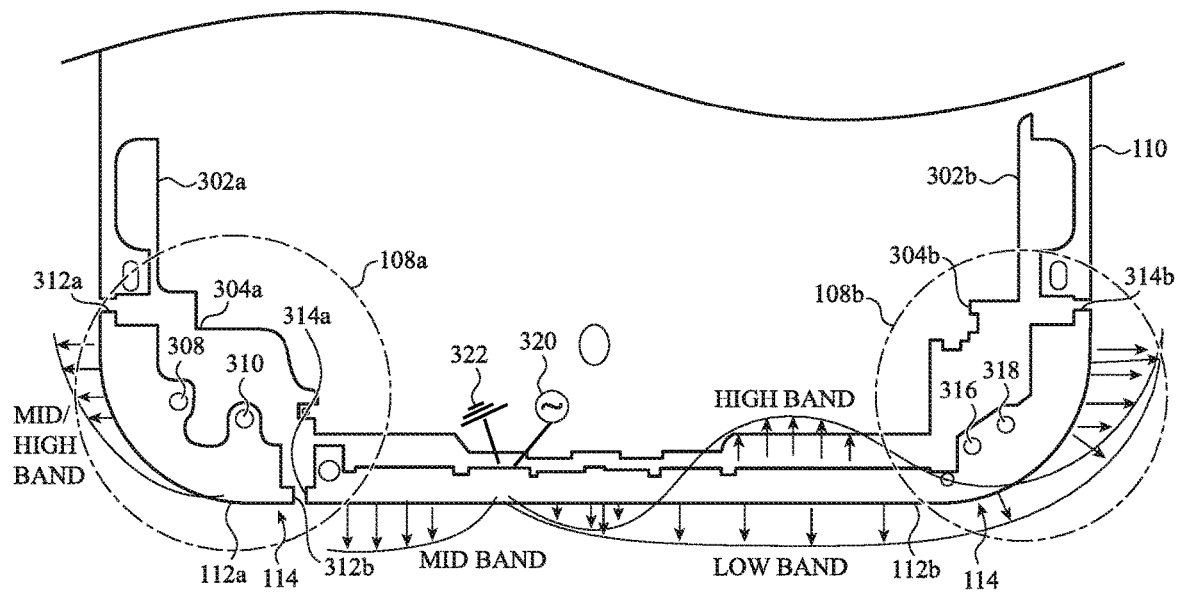

FIGS. 3A-3C show example implementations of the first, second, third, and fourth housing segments 112a, 112b, 112c, and 112d described with reference to FIGS. 1A-1C & 2A, and show example positions of the housing segments 112 with respect to a support plate 110. The housing segments 112 and support plate 110 may be examples of the housing segments and support plate described with reference to FIGS. 1A-1C & 2A.

Each of the housing segments 112 shown defines a rounded corner 108 of a housing sidewall 114. In alternative embodiments, the corners 108 may be squared corners, tapered corners of an octagon, or corners have other rounded or tapered shapes.

As shown primarily with reference to FIG. 3A, the first, second, third, and fourth housing segments 112a, 112b, 112c, 112d may not overlap the support plate 110 and may be electrically insulated from the support plate 110. A set of one or more non-conductive housing segments (not shown in FIG. 3A but shown in FIG. 4) may form a structural bridge or bridges between the support plate 110 and the housing segments 112, and in some cases may at least partially encapsulate portions of the support plate 110. As examples, the non-conductive housing segment(s) may adhere to the support plate 110 or be adhesively bonded to the support plate 110. In some cases, the housing segments 112 may have interlock features that extend inward from the ends of the housing segments 112, toward the support plate 110 or an interior volume defined at least in part by the housing segments 112, as shown in later figures. The non-conductive housing segment(s) may extend into, through, or around such interlock features, such that the non-conductive housing segment(s) may better hold, grab or retain the housing segments 112. Having a separation between the housing segments 112 and the support plate 110 can allow the housing segments 112 to resonate more freely when operated as antennas. The support plate 110 may be separated from some housing segments 112 (or some portions of housing segments 112) more than from other housing segments 112 (or other portions of housing segments 112). In alternative embodiments, the support plate 110 may extend under one or more of the housing segments 112 but be electrically insulated from the housing segments 112, or the support plate 110 may be grounded to one or more of the housing segments 112 at selected points (e.g., at a ground connection, such as the ground connection described 226 with reference to FIG. 2D).

As also shown in FIG. 3A, the support plate 110 may define portions (e.g., antenna portions) or entireties of one or more slot antenna features 302 (e.g., slot antenna features 302a, 302b, 302c, and 302d). By way of example, a slot antenna feature 302 is shown near each of the four main corners 304 (e.g., corners 304a, 304b, 304c, and 304d) of the support plate 110. A fifth housing segment may be coupled to the left edge 306a of the support plate 110 (i.e., the left edge as shown in FIG. 3A) and define further portions (e.g., further antenna portions) of the slot antenna feature 302a or 302c. Similarly, a sixth housing segment may be coupled to the right edge 306b of the support plate 110 and define further portions (e.g., further antenna portions) of the right-side slot antenna feature 302b or 302d. In some embodiments, the fifth housing segment may be electrically connected to, or disconnected from, the first or third housing segment 112a or 112c, thereby adding the left-side slot antenna feature 302a or 302c to the first or third housing segment 112a or 112c and enabling an antenna including the first or third housing segment 112a or 112c to resonate in a different wireless frequency band. In some embodiments, the sixth housing segment may be electrically connected to, or disconnected from, the second or fourth housing segment 112b or 112d, thereby adding the right-side slot antenna feature 302b or 302d to the second or fourth housing segment 112b or 112d and enabling an antenna including the second or fourth housing segment 112b or 112d to resonate in a different wireless frequency band, such as the B42 wireless frequency band. In some cases the fifth and sixth housing segments may be welded (e.g., spot welded or laser welded) to the support plate 110 along the left and right edges 306a, 306b of the support plate 110. In some embodiments, the support plate 110 or housing segments 112 may additionally or alternatively define all or portions of other antenna tuning features, FIG. 3A further shows potential locations of antennas 324, 326 that may be housed within the interior volume defined by the housing segments 112. In some embodiments, the interior antennas 324, 326 may be positioned at or near the corners defined by the first and third housing segments 112a, 112c. In other embodiments, the interior antennas 324, 326 may be positioned elsewhere. In some embodiments, the interior antennas 324, 326 may be used in combination with antennas incorporating the second and fourth housing segments 112b, 112d to operate in the B42 wireless frequency band. The interior antennas 324, 326 may be positioned near the left side of the sidewall 114 to provide good separation (and decoupling) from the antennas incorporating the second and fourth housing segments 112b, 112d.

In some embodiments, different portions 324a, 324b of the interior antenna 324 may be operated as different antennas to facilitate wireless communication in one or more wireless communication modes, in one or more wireless frequency bands.

FIGS. 3B and 3C show example locations of feed and short connectors to the housing segments 112a and 112b, which feed and short connectors enable the housing segments 112a, 112b to be operated as antennas. As used herein, the term "ground connector" may be used to refer to a short connector or a connection to ground or other reference voltage. The term "feed connector" may be used to refer to a signal supply connector or voltage supply connector. The locations of feed and ground connectors described with reference to FIGS. 3B and 3C can be replicated for the third and fourth housing segments 112c, 112d, or feed and ground connectors for the third and fourth housing segments 112c, 112d may be located in alternate locations.

As shown in FIG. 3B, feed and ground connectors 308, 310 for the first housing segment 112a may be located interior to the sidewall 114, on opposite sides of the first corner 108a. In the embodiment shown, the feed connector 308 may be located more toward the apex of the first corner 108a than the leftmost end 312a of the first housing segment 112a. The ground connector 310 may be located more toward the rightmost end 312b of the first housing segment 112a. Alternatively, the locations of the feed connector 308 and ground connector 310 may be swapped, with the feed connector 308 being located more toward the rightmost end 312b of the first housing segment 112a. The arrangement shown in FIG. 3B may be advantageous in that the ground connector 310, along with the gap between adjacent ends 312b, 314a of the first and second housing segments 112a, 112b, helps define a demarcation point between the antennas provided by the first and second housing segments 112a, 112b. The arrangement shown also enables a switchable coupling of the fifth housing segment and slot antenna feature 302a to the first housing segment 112a, to extend the length of the resonate portion of an antenna including the first housing segment 112a.

As also shown in FIG. 3B, feed and ground connectors 316, 318 for the second housing segment 112b may be located interior to the sidewall 114 near the second corner 108b. In the embodiment shown, the ground connector 318 may be located closer to the rightmost end 314b of the second housing segment 112b than the feed connector 315. Alternatively, the feed and ground connectors 316, 318 may be swapped, with the feed connector 316 being located more toward the rightmost end 314b of the second housing segment 112b. The arrangement shown in FIG. 3B enables a switchable coupling of the sixth housing segment and slot antenna feature 302b to the second housing segment 112b, to extend the length of the resonate portion of an antenna including the second housing segment 112b.

As shown, the resonate portion of the first housing segment 112a may resonate within frequencies of the mid and high bands described with reference to FIG. 11. The second housing segment 112b may have two resonate portions, with the leftmost resonate portion resonating within frequencies of the low and high wireless frequency bands described with reference to FIG. 11, and the rightmost resonant portion resonating within frequencies of the mid wireless frequency band described with reference to FIG. 11. The lengths of the arrows extending from the housing segments 112a, 112b represent the relative voltages along the housing segments 112a, 112b. Longer length arrows indicate increased voltage and areas of better antenna efficiency in various wireless frequency bands. As shown, the portions of the first and second housing segments 112a, 112b with highest efficiency are at various ends of the housing segments 112a, 112b. To achieve maximum possible efficiencies, it is therefore desirable to electrically insulate these ends (e.g., ends 312a, 312b, 314a, and 314b) from surrounding conductors, and to decouple (e.g., lower the capacitance of) these ends 312a, 312b, 314a, 314b with respect to surrounding conductors.

The antenna configuration described with reference to FIG. 3B provides good separation between the portions of the first and second housing segments 112a, 112b that resonate within the mid wireless frequency band. FIG. 3C shows alternative locations of feed and ground connectors 320, 322 for the second housing segment 112b. The alternative feed and ground connectors 320, 322 are located approximately in the middle of the lower edge of the sidewall 114 (and in some cases, somewhat closer to the first corner 108a, as shown). The feed connector 320 may be located closer to the second corner 108b, and the ground connector 322 may be located closer to the first corner 108a. This alternative configuration for feed and ground connectors 320, 322 of the second housing segment 112b may provide good or better low and high wireless frequency band efficiency, but may increase the likelihood of coupling between the portions of the housing segments 112a, 112b that resonate in the mid wireless frequency band, absent good electrical insulation between the adjacent ends 312b, 314a of the first and second housing segments 112a, 112b. In some embodiments, wireless communication circuitry may switchably connect the second housing segment 112b to the feed and ground connectors 316, 318 described with reference to FIG. 3B, or to the feed and ground connectors 320, 322 described with reference to FIG. 3C. One or the other set of connectors may be used as necessary in response to particular trigger conditions to improve antenna efficiency or other parameters.

Figure 4:
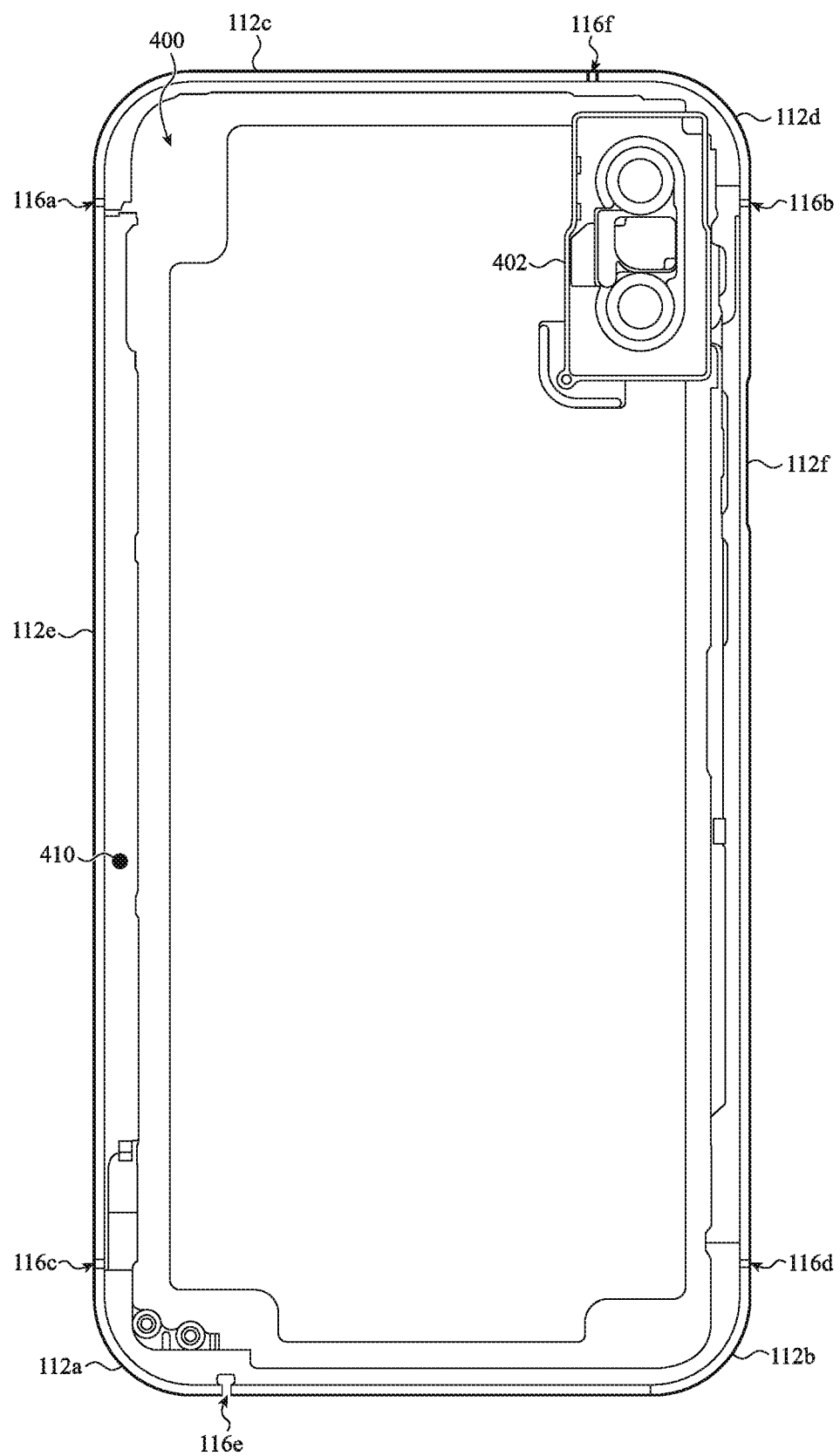
FIG. 4 depicts an example implementation of housing segments joined using one or more non-conductive housing segments.

FIG. 4 shows each of the first, second, third, fourth, fifth, and sixth housing segments 112a, 112b, 112c, 112d, 112e, and 112f described with reference to FIGS. 1A-1C, 2A, & 3A-3C in relation to the support plate 110 described with reference to FIGS. 1C & 3A-3C. FIG. 4 also shows an example non-conductive housing components formed from a single molded component 400 that structurally couples the housing segments 112 to each other and/or the support plate 110. By way of example, the molded component 400 may be formed form a fiber-filled polymer material in accordance with the other embodiments described herein. In this example, the molded component 400 structurally couples the housing segments 112 to each other and the support plate 110. Also in this example, the molded component 400 is a continuous piece of polymer that fills multiple gaps between the housing segments 112 to define multiple non-conductive housing components 116a, 116b, 116c, 116d (referred to generally as non-conductive housing components 116). The molded component 400 (which may also be referred to as a non-conductive housing segment) at least partially encapsulates portions of the support plate 110. The molded component 400, which includes the non-conductive housing segments 116 may be color-matched (or not color-matched) to the exterior surfaces of the housing segments 112.

The molded component 400 may also encapsulate or partially encapsulate portions of the housing segments that define an inner perimeter of the housing. In one example, the molded component defines a ledge 410 that extends around the inner perimeter of the housing. The ledge 410 may form a flat and continuous surface that can be used to mount or attach the a rear cover, rear cover assembly, front cover, front cover assembly, display, or other component of the device. The ledge 410 may also form a unitary or uniform sealing surface for a rear cover, rear cover assembly, front cover, front cover assembly, display, or other component of the device that defines a seal with the housing. By defining a single sealing surface, the molded component 400 may provide a seal that is less prone to failure or leakage as compared to a configuration that includes multiple sealing surfaces over multiple parts. Furthermore, if the molded component 400 partially encapsulates multiple housing segments 112 the molded component 400 may form an enhanced seal between the housing segments 112 by reducing the number of components that are sealed to each other in order to prevent water ingress or waterproofing.

FIG. 4 also shows a camera brace 402 that is structurally coupled to the upper right corner of the support plate 110. When the support plate 110 and camera brace 402 are metallic, the camera brace 402 may be welded to the support plate 110 for strength and to provide an electrical coupling between the support plate 110 and camera brace 402. The electrical coupling may enable the support plate 110 and camera brace 402 to be coupled to a common ground, which may improve the performance of the housing segments 112 when the housing segments 112 are operated as antennas. The camera brace 402 may provide a housing for one or more camera modules, such as one or more rear-facing camera modules (i.e., cameras with a field of view extending from the rear or non-display side of a device).

As mentioned previously, the non-conductive housing segments or splits may be formed from a polymer having an array of fibers dispersed within. The fibers may be aligned to along one or more directions that are transverse to (e.g., perpendicular to) one or more surfaces of an exterior surface of the non-conductive housing segment in order to improve the cosmetic appearance or surface finish of a split. As described herein, various techniques may be used to both align the fibers within the polymer matrix or binder and also treat the surface of the split to remove or reduce the amount of exposed fiber along the exterior surface.

Figure 5A:
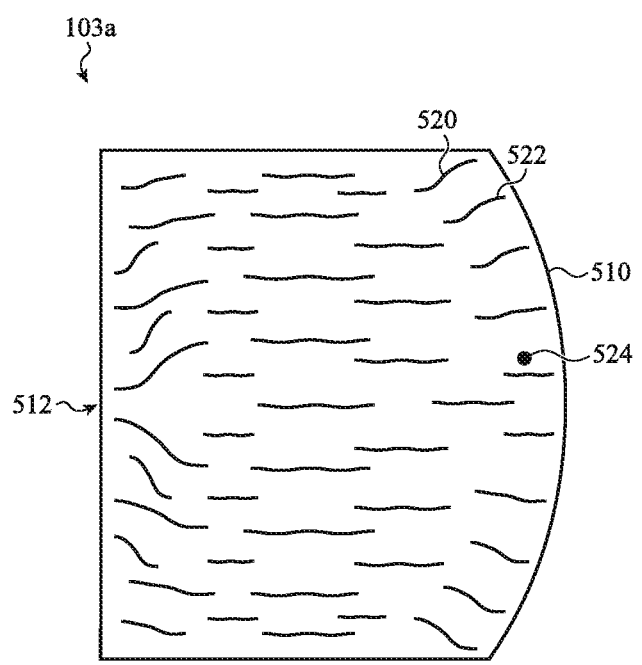
FIG. 5A depicts a cross-sectional view of a non-conductive housing segment along section B-B of FIG. 1A.

FIG. 5A depicts an example cross-sectional view of a non-conductive housing segment taken along section B-B of FIG. 1A. In particular, FIG. 5A depicts a non-conductive housing segment 103a or split having an array of fibers 520 that are dispersed within a polymer 524 also referred to herein as a polymer binder or polymer matrix. The non-conductive housing segment 103a defines at least a portion of an exterior surface of the device 100. As shown in the cross-sectional view of FIG. 5A, the non-conductive housing segment 103a defines an exterior surface 510 that extends along the sidewall of the device.

As shown in FIG. 5A, the fibers 520 are generally aligned along a direction so that the fibers 520 are transverse to (e.g., substantially perpendicular to) the exterior surface 510. In particular, each of the fibers 520 have an end portion 522 that are substantially perpendicular to a corresponding portion of the external or exterior surface 510. As shown in FIG. 5A, the alignment direction may not correspond to a single or sole direction when the exterior surface 510 has a curved or contoured shape. In this example, each end portion 522 is aligned such that it is substantially perpendicular to a corresponding portion of the exterior surface 510. However, each end portion 522 is not perfectly aligned with each other end portion as the alignment of individual end portions 522 change in accordance with the curvature of the exterior surface 510.

As shown in FIG. 5A, the fibers 520 are embedded or encapsulated in a polymer 524 (e.g., a polymer binder or polymer matrix). The polymer 524 may include one or more of polycarbonate, acrylonitrile butadiene styrene (ABS), polyurethane, polyether ether ketone (PEEK), polybutylene terephthalate (PBT), polyamide, and/or a combination of multiple polymer materials. The fibers 520 may include, without limitation, glass fibers (e.g., fiberglass), carbon fibers, metal nanowire, aramid fiber, and/or other fiber or wire (e.g., nanowire) materials. In general, the fibers 520 are dispersed within the polymer 524 to produce a substantially even or uniform fiber distribution. This may improve the structural characteristics of the polymer 524 and result in a non-conductive housing segment that is stronger and/or more impact resistant. The fibers 520 may also improve the dimensional stability of the non-conductive housing segment and may be configured to provide a coefficient of thermal expansion that corresponds to a coefficient of thermal expansion of the conductive or metal segments. In some cases, the fiber 520 comprises at least 20% of the component volume, also described as a 20% fiber fill. In some cases, the fiber 520 defines at least a 30% fiber fill. In some cases, the fiber 520 defines at least a 40% fiber fill.

By aligning the fibers 520 along a direction that is transverse to the exterior surface 510, the cosmetic appearance and tactile smoothness of the exterior surface 510 may be improved. For example, alignment of the fibers 520 as shown in FIG. 5A may reduce surface pitting or the presence of other potential surface defects that could adversely affect the visual appearance or tactile feel of the exterior surface 510. Furthermore, by aligning the fibers 520 as shown in FIG. 5A, any exposed ends of the fibers 520 (e.g., portions of the fibers 520 that extend from the exterior surface 510, are non-encapsulated ends, or otherwise protrude from the exterior surface 510) may be removed using a polishing operation. In some cases, the ends of the fibers 520 protrude only a few microns from the exterior surface 510. As discussed in more detail below with respect to FIG. 9, any exposed ends or portions of the fibers 520 may be removed using a polishing or buffing operation using an elastomer abrasive. In some cases, exposed ends or portions of the fibers 520 may be ablated or melted using a laser beam or laser-treatment process.

In general, the alignment of the fibers 520, as shown in FIG. 5A, may be achieved by a particular manufacturing process. As discussed in more detail below with respect to FIG. 9, the alignment of the fibers 520 may be created or facilitated by an injection molding process. In particular, the location of the injection points may help facilitate the alignment of the fibers 520 with respect to the exterior surface 510. In one example, the injection point (within the injection mold) may be substantially aligned with a region that corresponds to the portion of the exterior surface 510. By positioning the injection point relative to what will form the exterior surface 510, the flow path of the liquid polymer (having an array of fibers embedded within) may flow in a direction that is substantially perpendicular to the exterior surface. In such a configuration, fibers that are aligned within the polymer (when in the melted or liquid state) may maintain their alignment as the polymer is injected to form the non-conductive housing segment. Additionally or alternatively, the viscosity of the liquid polymer, the injection path, the temperature of the injection, and/or other manufacturing parameters may be configured to facilitate or maintain alignment of the fibers 520 during the molding process.

FIG. 5A depicts a non-conductive housing portion 103a as molded or, alternatively, after the exterior surface 510 has been machined. In some implementations the non-conductive housing portion 103a is molded into its final shape and the exterior surface 510 is formed during the molding process. In other implementations, the non-conductive housing portion 103a is molded to have excess material, which may be machined, ground, polished, or otherwise removed to form the exterior surface 510. The excess material, also referred to as an overshot, may help to obtain the desired fiber alignment along the exterior surface 510. The excess material may also serve as sacrificial material that may be removed during a final polishing or machining operation.

FIG. 5B-5E depict cross-sectional views of a non-conductive housing segment having excess material or an overshoot portion, which is later removed. As shown in FIGS. 5B-5E, the non-conductive housing portion may be molded with excess material in order to induce a particular polymer flow within the mold that promotes the alignment of the embedded fibers. As shown in each of the examples of FIGS. 5B-5E, the liquid polymer is allowed to flow across a region 514 that corresponds to the location of the exterior surface 510, while the housing segment is being molded. By promoting certain flow paths within the mold, the fibers that are embedded or suspended in the liquid polymer may tend to align along the corresponding region 514. After molding, the excess material or overshoot portion may be removed by a machining, grinding, polishing, or other material removal operation.

Figure 5B:
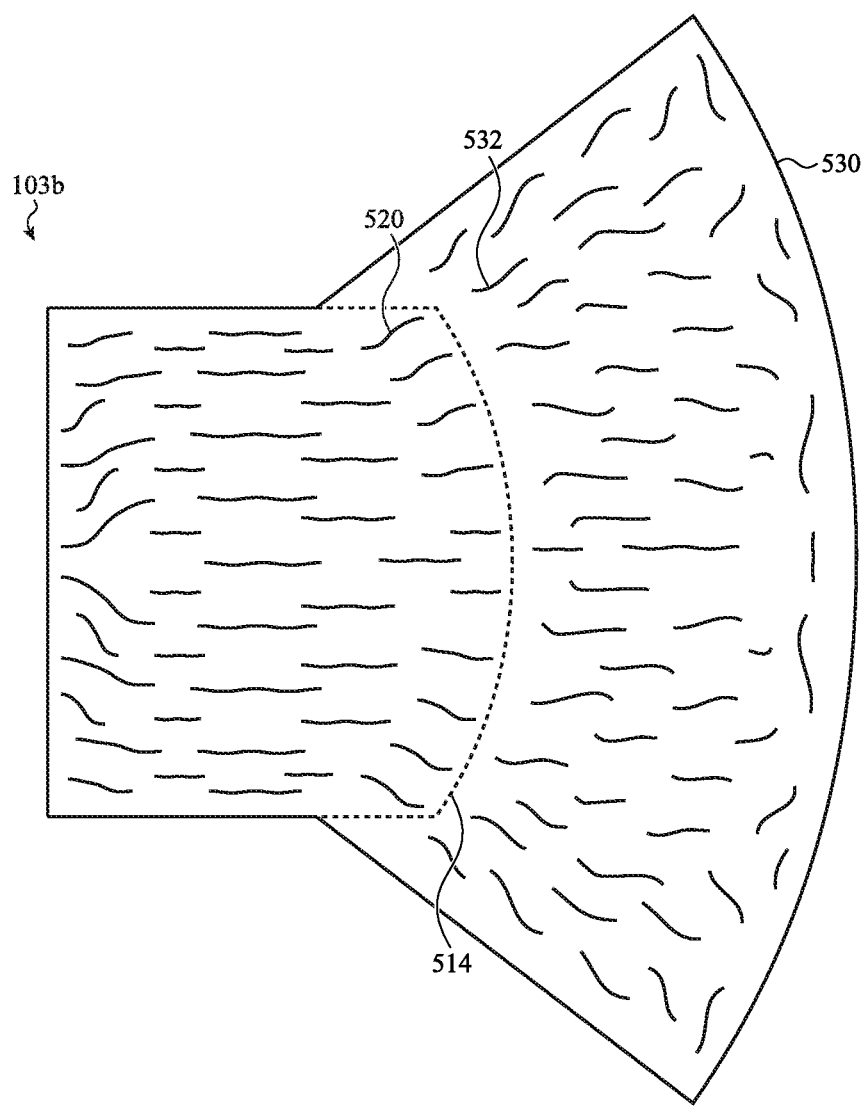
FIG. 5B-5E depict cross-sectional views of a non-conductive housing segment, as molded.

FIG. 5B depicts an example cross-sectional view of a non-conductive housing segment 103b having excess material or an overshoot portion 530 that may help align the embedded fibers with respect to an exterior surface of the housing segment. In particular, FIG. 5B depicts a non-conductive housing segment 103b having an array of fibers 520 that are substantially aligned to be transverse to (e.g., perpendicular to) a region 514 that generally corresponds to the location of the external surface of the non-conductive housing segment 103b, after the excess material or overshoot portion 530 has been removed. As shown in FIG. 5B, the excess portion 530 also includes an array of fibers 532 that are substantially aligned to be transverse to (e.g., perpendicular to) the region 514. In general, the fibers 520, 532 that are located proximate to region 514 are substantially aligned along one or more directions that are transverse (e.g., perpendicular) to the region 514. As discussed previously, the location of one or more injection points, the viscosity of the liquid polymer, the temperature of the liquid polymer, and/or the injection molding pressure may also be specified to facilitate the alignment of the fibers as shown in FIG. 5B.

As shown in FIG. 5B, the non-conductive housing segment 103b may have fibers that are not substantially aligned or are aligned along a direction that is not perpendicular to the region 514. In particular, fibers that are not located proximate to the region 514 may be arranged in any number of different directions that may depend on the flow direction of the liquid polymer or other molding parameters. Because the fibers located away from the region 514 will likely be fully embedded in the polymer, the fiber alignment is less critical to the surface finish of the non-conductive housing segment 103b.

In FIG. 5B, the overshoot portion 530 includes a protrusion having a contoured outer surface that has a shape that approximates or corresponds to the shape or curvature of what will eventually become the exterior surface (represented by region 514 in FIG. 5B). In some cases, the protrusion of the overshoot portion 530 extends a distance ranging from 2 mm to 5 mm beyond the region 514. In some cases, the protrusion of the overshoot portion 530 extends a distance ranging from 2.5 mm to 3.5 mm beyond the region 514. In a typical implementation, the overshoot portion 530 is machined after the non-conductive housing segment 103b is formed resulting in a smooth and/or polished exterior surface that is substantially free of fiber ends or exposed fibers.

Figure 5C:
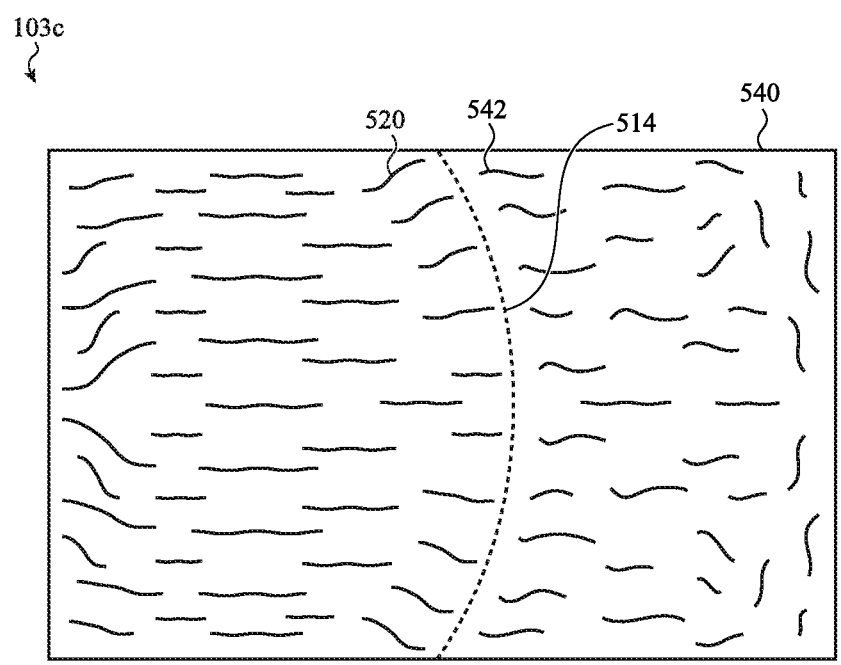

FIG. 5C depicts an example cross-sectional view of a non-conductive housing segment 103c having excess material or an overshoot portion 540 that may help align the embedded fibers with respect to an exterior surface of the housing segment. In particular, FIG. 5C depicts a non-conductive housing segment 103c having an array of fibers 520 that are substantially aligned to be transverse to (e.g., perpendicular to) a region 514 that generally corresponds to the location of the external surface of the non-conductive housing segment 103c, after the excess material or overshoot portion 540 has been removed. As shown in FIG. 5C, the excess portion 540 also includes an array of fibers 542 that are substantially aligned to be transverse to (e.g., perpendicular to) the region 514. Similar to the previous examples, fibers that are not located proximate to the region 514 (fibers that are located away from the region 514) may be arranged in any number of different directions that may depend on the flow direction of the liquid polymer or other molding parameters.

In the example of FIG. 5C, the overshoot portion 540 includes a protrusion having a rectangular shape that extends outward from the region 514. The rectangular shape of the overshoot portion 540 may simplify a post-machining operation since the upper and lower surfaces of the non-conductive housing segment 103c are formed during molding and may not require further machining. In some cases, the protrusion of the overshoot portion 540 extends a distance ranging from 2 mm to 6 mm beyond the region 514. In some cases, the protrusion of the overshoot portion 540 extends a distance ranging from 2.5 mm to 4.5 mm beyond the region 514. In a typical implementation, the overshoot portion 540 is machined after the non-conductive housing segment 103c is formed resulting in a smooth and/or polished exterior surface that is substantially free of fiber ends or exposed fibers.

Figure 5D:
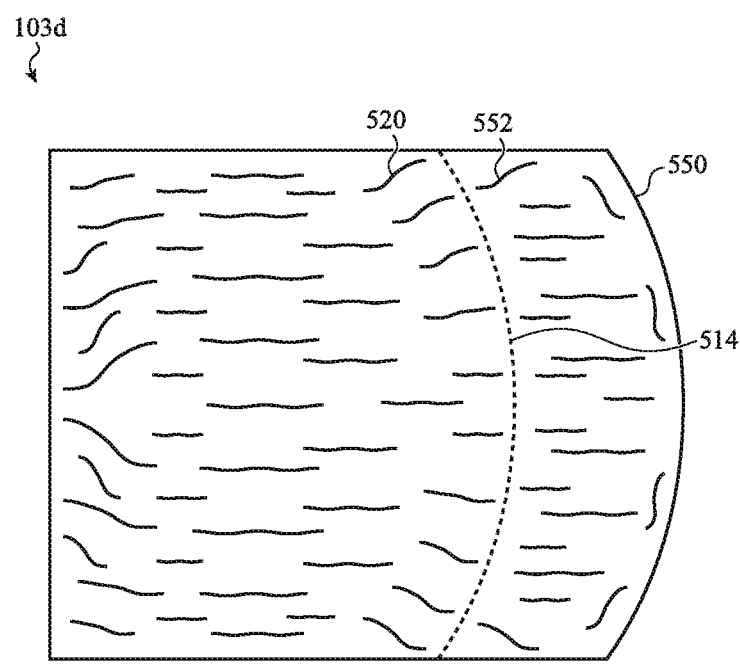

FIG. 5D depicts an example cross-sectional view of a non-conductive housing segment 103d having excess material or an overshoot portion 550 that may help align the embedded fibers with respect to an exterior surface of the housing segment. In particular, FIG. 5D depicts a non-conductive housing segment 103d having an array of fibers 520 that are substantially aligned to be transverse to (e.g., perpendicular to) a region 514 that generally corresponds to the location of the external surface of the non-conductive housing segment 103d, after the excess material or overshoot portion 550 has been removed. As shown in FIG. 5D, the excess portion 550 also includes an array of fibers 552 that are substantially aligned to be transverse to (e.g., perpendicular to) the region 514. Similar to the previous examples, fibers that are not located proximate to the region 514 (fibers that are located away from the region 514) may be arranged in any number of different directions that may depend on the flow direction of the liquid polymer or other molding parameters.

In the example of FIG. 5D, the overshoot portion 550 includes a protrusion having a contoured outer surface that has a shape that approximates or corresponds to the shape or curvature of what will eventually become the exterior surface (represented by region 514 in FIG. 5D). The smaller overshoot portion 550 may reduce the amount of machining or post-molding material removal resulting in cost savings or manufacturing throughput. In some cases, the protrusion of the overshoot portion 550 extends a distance ranging from 0.05 mm to 3 mm beyond the region 514. In some cases, the protrusion of the overshoot portion 550 extends a distance ranging from 0.1 mm to 0.5 mm beyond the region 514. In a typical implementation, the overshoot portion 550 is machined after the non-conductive housing segment 103d is formed resulting in a smooth and/or polished exterior surface that is substantially free of fiber ends or exposed fibers.

Figure 5E:
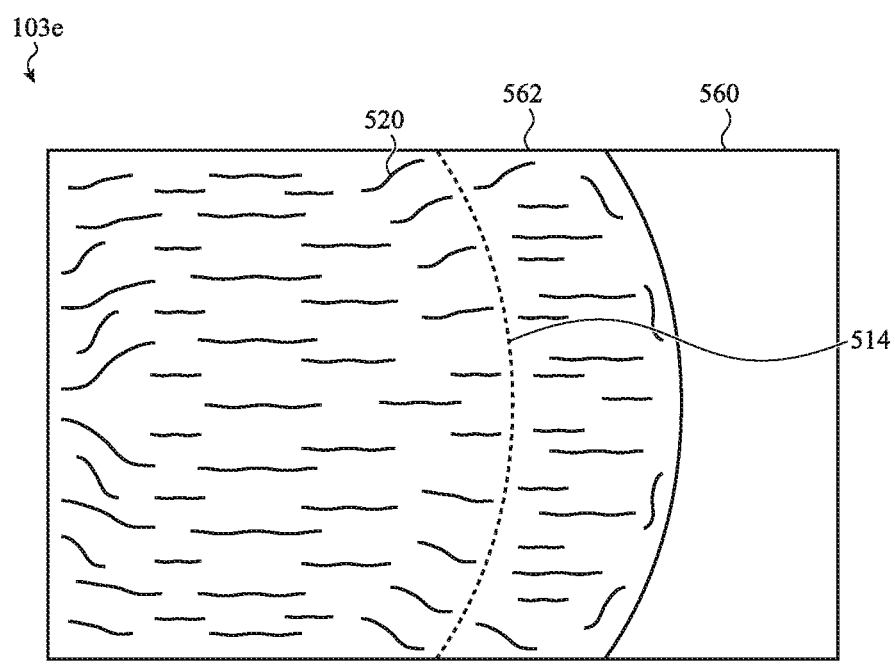

FIG. 5E depicts an example cross-sectional view of a non-conductive housing segment 103e having excess material or an overshoot portions 560 and 562, each having a different shape or profile. Similar to the previous example, the overshoot portions 560 and 562 may help align the embedded fibers with respect to an exterior surface of the housing segment. In particular, FIG. 5E depicts a non-conductive housing segment 103e having an array of fibers 520 that are substantially aligned to be transverse to (e.g., perpendicular to) a region 514 that generally corresponds to the location of the external surface of the non-conductive housing segment 103e, after the excess material or overshoot portions 560 and 562 have been removed.

In the example of FIG. 5E, the overshoot portion 562 includes a protrusion having a contoured outer surface that has a shape that approximates or corresponds to the shape or curvature of what will eventually become the exterior surface (represented by region 514 in FIG. 5E). The non-conductive housing segment 103e also includes an overshoot portion 560 that may be rectangular in shape similar to the example described above with respect to FIG. 5C. A similar rectangular overshoot portion may also be located along an opposite side of the non-conductive housing segment 103e resulting in two rectangular overshoot portions 560 that sandwich or enclose the contoured overshoot portion 562. This arrangement may provide for favorable polymer flow conditions to help align the fibers while also reducing the amount of material that needs to be removed post-molding. In some cases, the protrusion of the overshoot portion 562 extends a distance ranging from 0.05 mm to 3 mm beyond the region 514. In some cases, the protrusion of the overshoot portion 562 extends a distance ranging from 0.1 mm to 0.5 mm beyond the region 514. In some cases, the protrusion of the overshoot portion 560 extends a distance ranging from 0.1 mm to 5 mm beyond the region 514. In some cases, the protrusion of the overshoot portion 560 extends a distance ranging from 0.5 mm to 2 mm beyond the region 514. In a typical implementation, the overshoot portions 560 and 562 are machined after the non-conductive housing segment 103e is formed resulting in a smooth and/or polished exterior surface that is substantially free of fiber ends or exposed fibers.

Figure 6A:
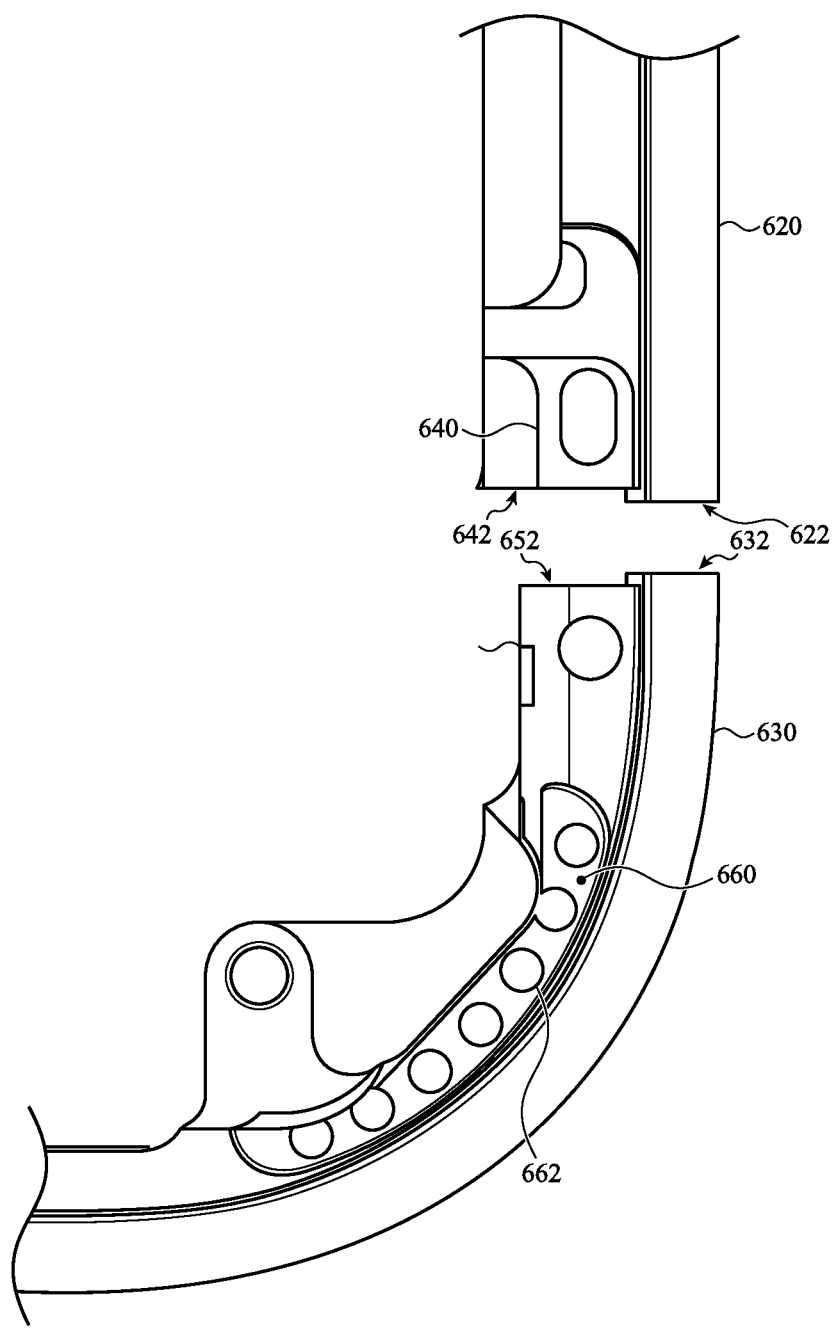
FIGS. 6A-6B depict an example multi-segment housing before a non-conductive housing segment is formed.
Figure 6B:
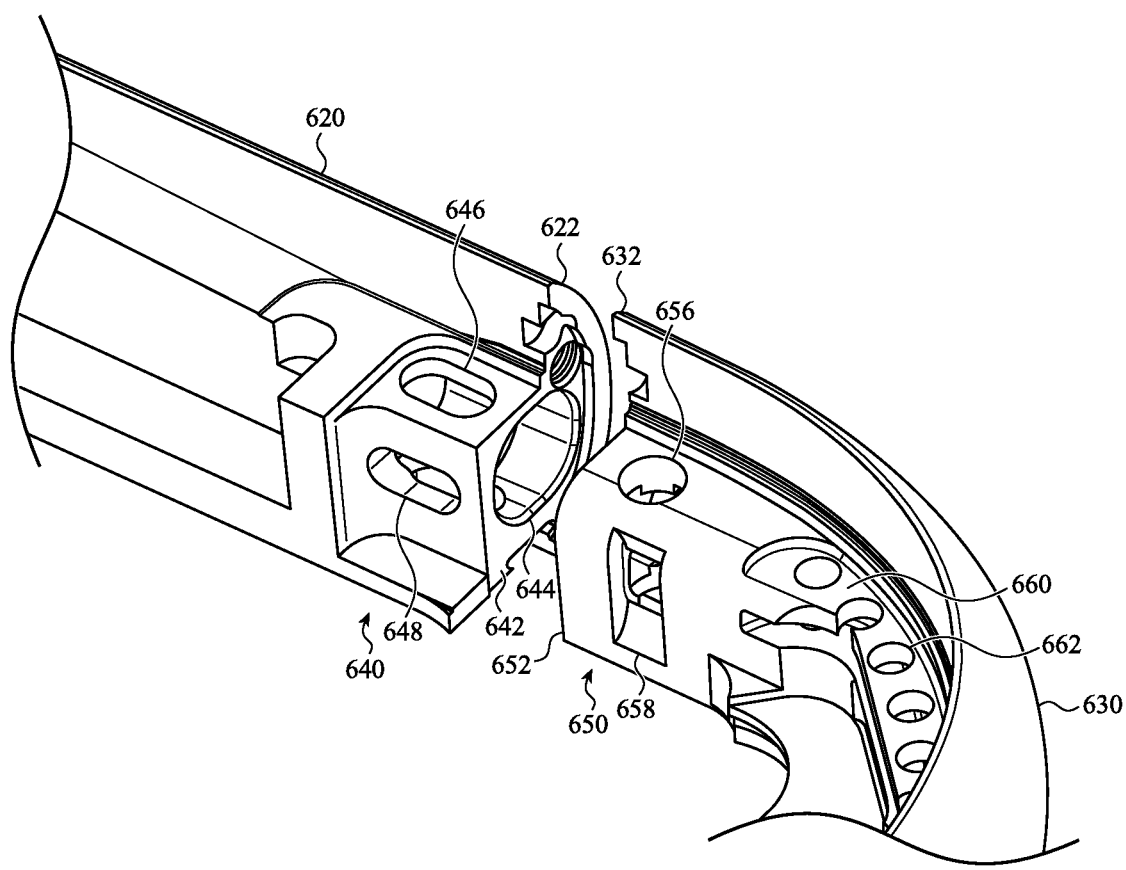

FIGS. 6A-6B depict an example multi-segment housing before a non-conductive housing segment is formed. FIG. 6A depicts a top view of the multi-segment housing 602 and FIG. 6B depicts a perspective view of the multi-segment housing 602. The multi-segment housing 602 of FIGS. 6A and 6B may correspond to any of the housings described herein and include the various features discussed with respect to those housings.

In the present example, the multi-segment housing 602 includes a first housing segment 620 and a second housing segment 630. Similar to the examples described with respect to other embodiments, one or both of the first housing segment 620 and the second housing segments 630 may be operatively coupled to wireless communication circuitry and be configured to operate as an antenna for the device. The first housing segment 620 and the second housing segment 630 may be formed from a conductive material including a metal or metal alloy. Example metals include, without limitation, steel, stainless steel, aluminum, titanium, and/or a metal alloy.

As shown in FIG. 6A, the first housing segment 620 include an interlock feature 640 that is formed along an inner portion of the housing segment 620. The inner portion is opposite to an exterior surface or exterior sidewall surface of the first housing segment. In this case, the interlock feature 640 extends inward or into an interior volume defined by the housing. The interlock feature 640 may be integrally formed with the other portions of the first housing segment 620 or, alternatively, may be a discrete component or element that is attached to (e.g., welded, fastened, or adhered to) the other portions of the first housing segment 620.

In this example, the first housing segment 620 defines a first end surface 622 formed along an end of the first housing segment 620. The first end surface 622 is opposite a second end surface 632 of the second housing segment 632. The first end surface 622 and the second end surface 632 define an external gap that is eventually filled with the non-conductive housing segment (see non-conductive housing segment 703 of FIGS. 7A and 7B). Similarly, an internal gap is defined between a first interlock surface 642 of the first interlock 640 and a second interlock surface 652 of the section interlock 650. As shown in FIGS. 6A and 6B, the first interlock surface 642 is opposite to or faces the second interlock surface 652. The interior gap is also eventually filled with the non-conductive housing segment (see non-conductive housing segment 703 of FIGS. 7A and 7B). In this example, the first interlock surface 642 is offset from the first end surface 622 and the second interlock surface 652 is offset from the second end surface 632. As a result, the external gap has a width that is less than a width of the internal gap.

In some cases, the wider internal gap as compared to the external gap results in a lip 441 defining an internal surface. The internal surface may, in some implementations, have a draft or angle that forms an undercut for engaging the polymer of the non-conductive housing segment. For example, the lip 441 may have an angled surface that extends toward the external surface of the sidewall as the lip 441 extends inward from the end surface 622. This creates a negative draft angle or inward angle of the lip 441 as the lip 441 extends inward from the end surface 622. As a result, the thickness of the lip 441 portion of the first housing segment 620 may get slightly thinner further inward from the end surface 622. A similar shaped undercut may be formed into the opposing lip formed in the second housing segment 630. The undercuts in the corresponding lips may create a structural or mechanical engagement between the first and second housing segments 620, 630 and the non-conductive housing segment.

Figure 7A:
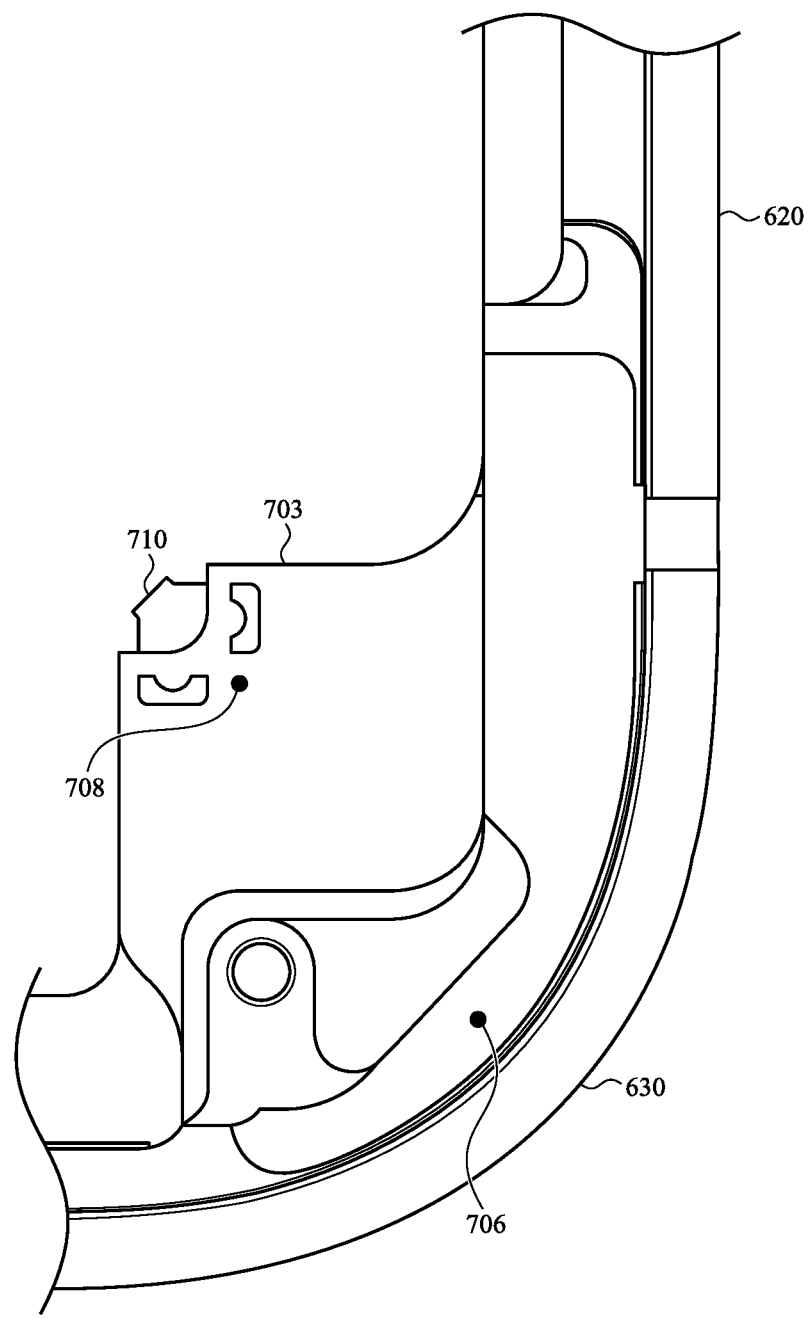
FIGS. 7A-7B depict an example multi-segment housing after a non-conductive housing segment is formed.
Figure 7B:
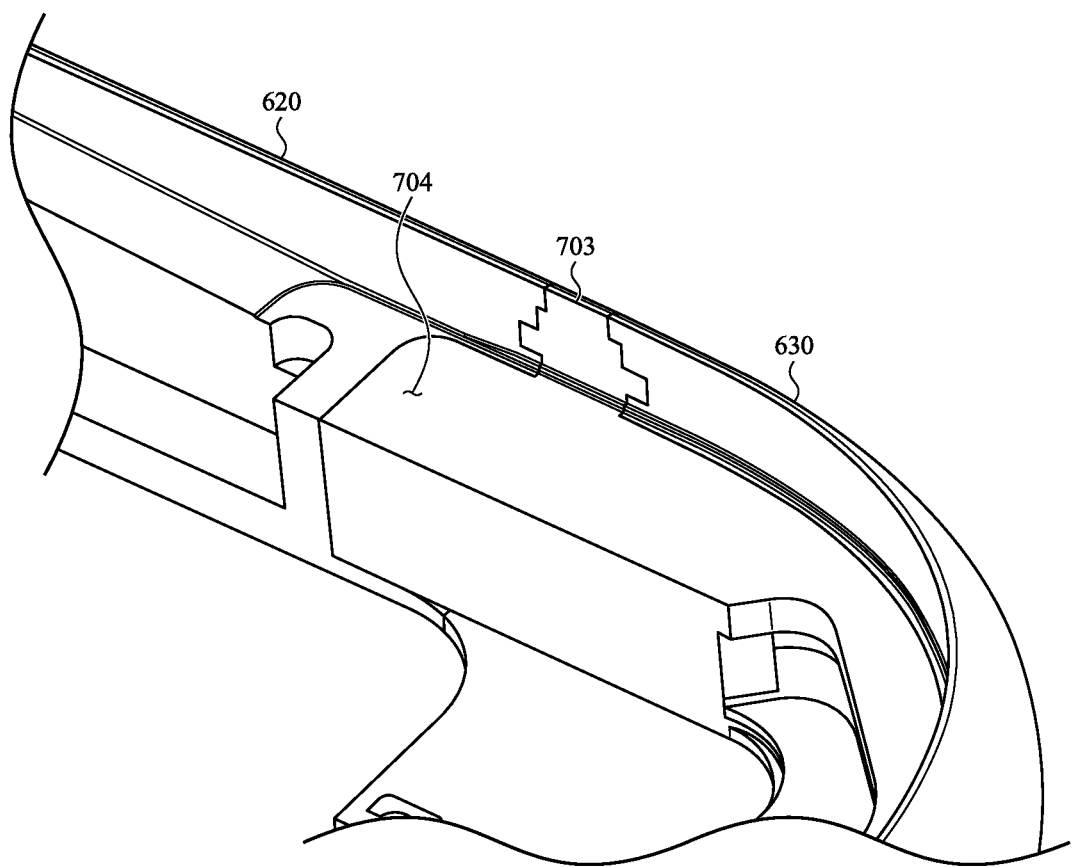

As shown in FIGS. 6A and 6B, the interlock features 640, 650 include various features or elements that facilitated structural engagement with the non-conductive housing segment (703 of FIGS. 7A and 7B. In particular, the first interlock feature 640 includes a first opening 644 that is formed into the first interlock surface 642. In some cases, the first opening 644 is a blind hole or blind recess. The first opening 644 may have a circular shape or profile or may have a shape a portion of which corresponds to a curvature of the exterior surface or sidewall defined by the first housing segment 620. In general, the polymer of the non-conductive housing segment may extend into or at least partially fill the first opening 644 of the first interlock feature 640. By at least partially filling the first opening 644, the first housing segment 620 may be structurally engaged with the non-conductive housing segment by forming a structural interlock or joint.

Similarly, the second interlock feature 650 includes a second opening 654 that is formed into the second interlock surface 652. Similar to the other opening, the second opening 654 may be a blind hole or blind recess. The second opening 654 may have a circular shape or profile or may have a shape a portion of which corresponds to a curvature of the exterior surface or sidewall defined by the second housing segment 630. In general, the polymer of the non-conductive housing segment may extend into or at least partially fill the second opening 654 of the second interlock feature 650. By at least partially filling the second opening 654, the second housing segment 630 may be structurally engaged with the non-conductive housing segment by forming a structural interlock or joint. Moreover, the structural engagement between the interlock features 640, 650 and the non-conductive housing segment results in a structural coupling between the first housing segment 620 and the second housing segment 630.

In the example of FIGS. 6A and 6B, the interlock features 640, 650 include additional features that may improve the structural engagement between the various housing segments. In particular, the first interlock feature 640 includes a first transverse opening or hole 646 and a second transverse opening or hole 648. The first and second transverse holes 646, 648 extend into a protrusion or body of the first interlock feature 640 and intersect with the first opening 644. By intersecting with the first opening 644, the first and second transverse holes 646, 648 define a continuous flow path through which the polymer of the non-conductive housing segment (703 of FIGS. 7A and 7B) may flow when the non-conductive housing segment or split is being molded. As a result, the polymer of the non-conductive housing segment at least partially fills the first and second transverse holes 646, 648 of the first interlock feature 640. As a result, the first and second transverse holes 646, 648 may enhance the structural engagement between the first housing segment 620 and the non-conductive housing segment (703 of FIGS. 7A and 7B).

As shown in FIGS. 6A and 6B, the second interlock feature 650 also includes a first transverse hole 656 and a second transverse hole 658 that extend into a body or protrusion of the second interlock feature 650. As described above, the first and second interlock features 656, 658 may intersect the second opening 654 to define a flow path resulting in the polymer at least partially filling the first and second interlock features 656, 658 thereby increasing or enhancing the structural engagement between the second housing segment 630 and the non-conductive housing segment (703 of FIGS. 7A and 7B).

As shown in FIGS. 6A and 6B, there may be other features that can be used to structurally engage the first or second housing segments 620, 630 with the non-conductive housing segment (703 of FIGS. 7A and 7B). In particular, the second housing segment 620 may include a machined recess 660 that is formed along a shelf of the internal or inner portion of the second housing segment 620. An array of holes 662 may be formed into a surface of the machined recess 660 and may be at least partially filled with the polymer of the split (e.g., the non-conductive housing segment 703 of FIGS. 7A and 7B).

FIGS. 7A-7B depict an example multi-segment housing after a non-conductive housing segment is formed. As shown in FIGS. 7A and 7B, the non-conductive housing segment 703 at least partially encapsulates the interlock features of the first housing segment 620 and the second housing segment 630 to structurally couple the first and second housing segments. As described above with respect to FIGS. 6A and 6B, the non-conductive housing segment 703 at least partially fills the openings, holes, and recesses of the interlock features thereby creating or enhancing the structural coupling between the housing segments.

As shown in FIGS. 7A and 7B, the non-conductive housing segment 703 fills the exterior gap and the interior gap defined between the first and second housing segments 620, 630. In some implementations, the non-conductive housing segment 703 at least partially encapsulates an interior surface(s) of the housing segments and forms a water-tight or waterproof seal between the first and second housing segments 620, 630. The water-tight or waterproof seal may be due to a surface bond formed between the (interior) surfaces of the first and second housing segments 620, 630 and mating surfaces of the non-conductive housing segment 703. In some implementations, the surface bond is improved or facilitated by etching portions (e.g., one or more interior surfaces) of the first and second housing segments 620, 630 to enhance the roughness of the respective portions thereby enhancing the bond.

As discussed previously, the non-conductive housing segment 703 electrically insulates the first housing segment 620 from the second housing segment 630. In addition to the non-conductive housing segment 703 being formed from a non-conductive material (e.g., a fiber reinforced polymer), the gap filled by the non-conductive housing segment 703 may be configured to reduce capacitive coupling between the first housing segment 620 and the second housing segment 630. In some cases, the exterior gap width and the size of the first and second end surfaces 622, 632 may be configured to minimize capacitive coupling. Furthermore, the interior gap width defined between the first and second interlock surfaces 642, 652 may be configured to reduce or capacitive coupling between the first housing segment 620 and the second housing segment 630.

The configuration depicted in FIGS. 6A, 6B, 7A, and 7B represent a tradeoff between having a sufficiently large interior and exterior gaps to provide capacitive isolation while being sufficiently small to ensure a reliable and strong structural connection between the housing segments. By way of example, the width of the interior gap is approximately equal to or correspond to the thickness of the first and second housing segments 620, 630. In some cases, the interior gap is approximately +/−10% of the thickness of the first and second housing segments 620, 630 as measured in a direction perpendicular to the gap width and in a direction that is parallel to the front face of the device. In some cases, the interior gap is approximately +/−20% of the thickness of the first and second housing segments 620, 630. In some cases, the interior gap is approximately +/−30% of the thickness of the first and second housing segments 620, 630. Similarly, the external gap width may be approximately equal to or correspond to the thickness of the first and second end surfaces 622, 632 of the first and second housing segments 620, 630. In some cases, the exterior gap is approximately +/−10% of the thickness of the first and second end surfaces 622, 632 as measured across the first and second end surfaces 622, 632 in a direction parallel to a front face of the device. In some cases, the exterior gap is approximately +/−20% of the thickness of the first and second end surfaces 622, 632. In some cases, the exterior gap is approximately +/−30% of the thickness of the first and second end surfaces 622, 632.

As shown in FIGS. 7A and 7B, the non-conductive housing segment 703 at least partially fills the machined recess (660 of FIGS. 6A and 6B) and the array of holes (662 of FIGS. 6A and 6B). This may increase or enhance the structural engagement between the housing segments and, in some cases, may enhance the waterproofing or sealing between the second housing segment 620 and the non-conductive housing segment 703. The machined recess may also allow for a minimum thickness of a corresponding corner portion of the non-conductive housing segment 703. As shown in FIG. 7A, the non-conductive housing segment 703 includes a corner portion 706 that extends along a corner of the second housing segment 630. In some cases, the corner portion 706 has a minimum thickness of approximately 0.4 mm. In some cases, the corner portion 706 has a minimum thickness of approximately 0.5 mm. In some cases, the corner portion 706 has a minimum thickness of approximately 0.7 mm or greater. The minimum thickness of the corner portion 706 may result in a more reliable housing segment that has an improved ability to survive corner impacts or drops. In some cases, the corner portion 706 has a maximum thickness of approximately 0.7 mm.

As shown in FIGS. 7A and 7B, the non-conductive housing segment 703 also at least partially encapsulates another component that is positioned within the interior volume of the housing. For example, as discussed above with respect to FIG. 3A, a portion of the non-conductive housing segment 703 may partially encapsulate support plate positioned in the interior volume of the housing. In the example of FIG. 7A, the non-conductive housing segment 703 includes an inner portion 708 that at least partially encapsulates internal component 710, which may be a support plate, electrical component, structural component, or other component of the device.

As shown in FIGS. 7A and 7B, the non-conductive housing segment 703 may define a ledge 704 having a surface that is flush with one or more surfaces of the first or second housing components 620, 630. In some implementations, the ledge 704 forms part of a mounting surface used to mount a cover assembly that includes a cover sheet and/or a display element. In some implementations, the ledge 704 is sufficiently flat to form a seal between a cover assembly and the remaining portions of the housing. In some cases, the ledge 704 extends around an entire inner perimeter of the housing (across multiple housing segments) to form a continuous and uniform sealing surface. In embodiments where the ledge 704 extends around the inner perimeter of the housing, the ledge 704 may form a unitary or uniform sealing surface for a rear cover, rear cover assembly, front cover, front cover assembly, display, or other component of the device that defines a seal with the housing. The non-conductive housing segment 703 may also include one or more attachment features (threaded holes, clips, or tabs) that are used to couple the housing to other components of the device. While only one ledge 794 is depicted in FIG. 7B, a second or opposite ledge may be defined along an opposite interior surface of the housing.

Figure 8:
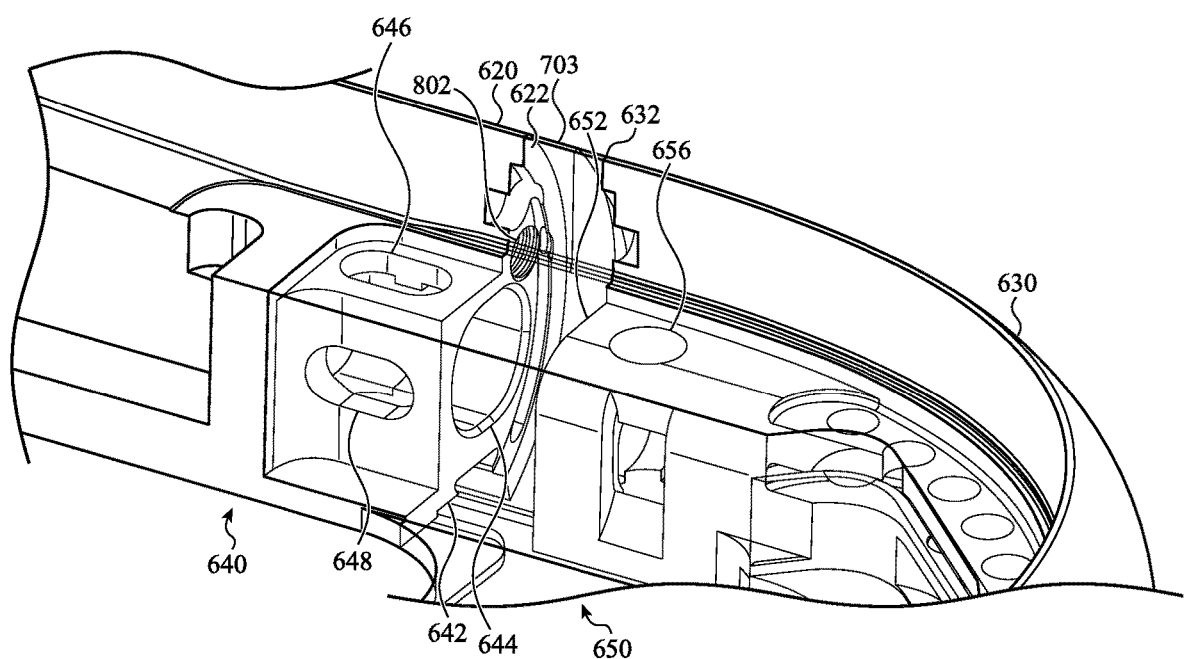
FIG. 8 depicts a detail view of the example multi-segment housing of FIGS. 7A and 7B.

FIG. 8 depicts detail view of the example multi-segment housing of FIGS. 6A, 6B, 7A, and 7B. Specifically, FIG. 8 depicts aspects of the first housing segment 620 described above with respect to FIGS. 6A and 6B. In FIG. 8, the first interlock feature 640 has been enlarged to better illustrate the various features and elements. As shown in FIG. 8, the first interlock feature 640 defines a first interlock surface 642 and a first opening 644 that extends into the first interlock surface 642. The first interlock feature 640 also includes a first transverse hole 646 and a second transverse hole 448 that extend into a protrusion or body of the first interlock feature 640 to intersect the first opening 644.

Similarly, as shown in FIG. 8, the second interlock feature 650 has been enlarged to better illustrate the various features and elements. As shown in FIG. 8, the second interlock feature 650 defines a second interlock surface 652 and a second opening 654 that extends into the second interlock surface 652. The second interlock feature 650 also includes a first transverse hole 656 and a second transverse hole 458 that extend into a protrusion or body of the second interlock feature 650 to intersect the second opening 654.

FIG. 8 also depicts the first end surface 622 of the first housing segment 620 and the second end surface 632 of the second housing segment 630. As described previously, the first end surface 622 is opposite to or faces the second end surface 632 and defines an exterior gap. The exterior gap is filled with a portion of the non-conductive housing segment 703, which defines a portion of an exterior surface or exterior sidewall of the device.

As shown in FIG. 8, the first housing segment 620 also includes a threaded hole 802. In this example the threaded hole 802 extends into the first interlock surface 642 and is substantially parallel to the first opening 644. The threaded hole 802 may include helical threads and may be at least partially filled with the polymer of the non-conductive housing segment 703. the threads of the threaded hole 802 may increase or enhance the structural engagement between the first housing segment 620 and the non-conductive housing segment 703. The threaded hole 802 may also enhance the strength or durability of the non-conductive housing segment 703 at a location that is susceptible to damage from impact or drops.

Figure 9:
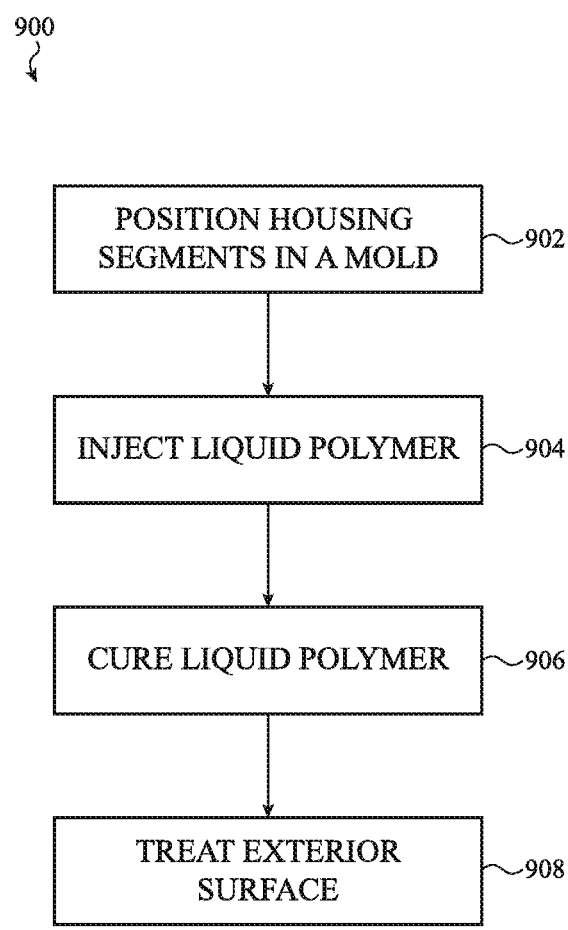
FIG. 9 depicts an example process for manufacturing a multi-segment housing.

FIG. 9 depicts an example process for manufacturing a multi-segment housing. In particular, FIG. 9 depicts operations of an example process 900 for manufacturing a multi-segment housing in accordance with the embodiments described herein. The process 900 may be used to form a multi-segment housing having non-conductive housing segments that electrically isolate and structurally couple or connect two or more housing segments of the housing. The process 900 may be used to form a non-conductive housing segment or split that is formed using a single molding process or "single shot" as compared to other process that may use multiple molding processes or shots to produce a first structural portion (having fibers) and a second cosmetic portion (without fibers). In the process 900, the non-conductive housing segment may have an array of fibers that are dispersed within a polymer matrix or binder and the ends of the array of fibers may be aligned to be substantially perpendicular with an exterior surface of the device. An example resulting structure is described above with respect to FIGS. 5A-5E.

The process 900 may be used to form a multi-segment housing in which one or more of the housing segments is configured to operate as an antenna. In some implementations, the non-conductive housing segment is configured to electrically isolate or insulate (e.g., conductively or capacitively isolate or insulate) two adjacent conductive housing segments. In some cases, the non-conductive housing segment is cosmetic in nature and, while positioned between two adjacent housing segments, the non-conductive housing segment does not perform an electrical isolation or insulation function.

In operation 902, one or more housing segments are positioned in a mold. More specifically, a first housing segment and a second housing segment (alone or in combination with other housing segments) may be placed in an opening or cavity defined within a mold of an injection molding machine. In general, the mold may include a cavity portion and a core portion that may be separated in order to insert the housing segments. The housing segments may be placed in a portion of either the cavity or core portion and held in place by one or more fixtures or features that are integrated with the mold or molding fixture. In some implementations, the first and second housing segments are positioned with respect to a datum or reference feature that maintains alignment of the surfaces of the housing segments that will eventually define the exterior surface(s) of the housing or device. Maintaining alignment of the housing segments along these surfaces may allow the housing to be complete with minimal finishing, grinding, or trimming after the molding operations of operations 904 and 906 described below.

As discussed previously, the first and second housing segments may formed from a conductive material and may define respective portions of an exterior surface of the housing or device. In particular, the first and second housing segments may be formed from a metal material including without limitation, steel, stainless steel, aluminum, titanium, or other metal or metal alloy. In some cases, the surfaces of the first and second housing segments that will define the exterior surface(s) of the device are polished or otherwise treated to have a suitable final surface finish for the finished product. Other interior surfaces of the first and second housing segments may be treated to provide a surface finish that will facilitate bonding with the polymer. For example, one or more interior surfaces may be chemically etched or blasted to provide a particular surface roughness that will bond more readily to the polymer material.

In operation 903, a liquid polymer is injected into a gap defined between the first and second housing segments. In particular, after the first and second housing segments are placed into the mold, the mold portions (e.g., the cavity portion and the core portion) are brought together to define an enclosed cavity containing the first and second housing segments. The first and second housing segments are positioned to define a gap between respective ends of the housing segments. The polymer generally includes a melted or liquid form of polycarbonate, acrylonitrile butadiene styrene (ABS), polyether ether ketone (PEEK), polybutylene terephthalate (PBT), or polyamide The liquid polymer also generally includes a fiber fill, which may include glass fibers (e.g., fiberglass), carbon fibers, metal nanowire, aramid fiber, and/or other fiber or wire (e.g., nanowire) materials that are dispersed throughout the polymer matrix or polymer binder.

In operation 903, the polymer may be injected in a way that aligns or maintains the alignment of a portion or an array of the fibers that are dispersed within the polymer. More specifically, a portion, subset, or array of fibers that are located along what will be the exterior surface of the non-conductive housing segment may be aligned along a fiber direction. As discussed above with respect to FIGS. 5A-5E, the fiber alignment direction may not be a single direction if the exterior surface is contoured but rather may correspond to one or more directions that correspond to the contour of the exterior surface. In general, the subset or array of fibers located proximate the surface may be substantially perpendicular to the exterior surface after the housing segment has been molded.

The fiber alignment may be maintained by controlling one or more of, injection temperature, injection pressure, polymer viscosity, the location of one or more injection points, the injection flow path, or the component or segment geometry. By way of example, the polymer may be injected into the gap through one or more injection points (e.g., an injection ports or injection gates). The injection points may be substantially aligned with the gap to provide a straight or direct flow of liquid polymer into the gap. In some implementations, the liquid polymer is injected at an injection point that is substantially aligned with a region that corresponds to the third portion of the exterior surface of the housing. By aligning the injection point with a region along the gap, the liquid polymer may be injected at the injection point to flow in a flow direction that is substantially perpendicular to what will become the exterior surface of the non-conductive housing segment. In some implementations, providing a particular flow path (e.g., perpendicular to the third portion of the exterior surface of the device) may facilitate or provide an alignment of at least a portion of the fibers that will be located proximate the exterior surface of the segment.

In operation 906, the liquid polymer is cured. In particular, the liquid polymer may be cooled or allowed to set to form a solid component. The cured housing segment may define a third portion exterior surface of the housing having the one or more fiber directions that are substantially perpendicular to the portion exterior surface of the housing. As discussed above, a subset or array of fibers that are located along or proximate the exterior surface may be aligned along a direction that is perpendicular to the exterior surface. As discussed previously, if the exterior surface is contoured or curved, the alignment direction may vary within the part but the fiber direction of any particular fiber or group of fibers may be substantially perpendicular to the exterior surface.

In some embodiments, the housing segment is molded into a final shape that is treated in operation 908. In other embodiments, the housing segment includes excess material or an overshoot portion that must be machined to form the exterior surface. Examples of excess material or overshoot portions are described above with respect to FIGS. 5B-5E. In some cases, the excess or overshoot portions are removed using a computer-numeric-control (CNC) machine that forms the exterior surface. In some cases, the CNC machine may also remove portions of the conductive (metal) housing segments to form a smooth continuous surface between the housing segments. Additionally or alternatively, other material removal techniques may be used including, without limitation, laser ablation, laser melting, laser cutting, abrasive grinding, surface blasting, and so on.

In operation 908, the exterior surface may be treated. Operation 908 may be an optional operation in some implementations of process 900. In operation 908, the exterior surface may be treated (e.g., polished) to remove any exposed or non-encapsulated ends of the fibers. Exposed ends or non-encapsulated ends may be used to refer to portions of the fibers (of the array of fibers) that extend or protrude from the exterior surface. As discussed previously, fiber-filled polymers may produce a surface finish that is non-uniform or, in some cases, appears or feels fuzzy or unpolished due to the presence of exposed or non-encapsulated ends of the fibers. Operation 908, in combination with the fiber alignment produced using the other operations of process 900 may reduce or eliminate this effect.

In one embodiment of operation 908, the exterior surface of the non-conductive housing segment is polished using a soft abrasive material. In particular, the exterior surface of the non-conductive housing segment may be polished using an elastomer-based soft abrasive material to produce a polished surface. The elastomer-based material may include a rubber or elastomer having a hardness ranging between 20 and 50 on a Shore A hardness scale. In some cases, the elastomer-based material may have a hardness ranging between 30 and 45 on a Shore A hardness scale. The abrasive material may be formed from a synthetic rubber, plastic, or other similar material. The abrasive material may or may not include an abrasive particulate that is encapsulated or dispersed within the elastomer-based material. Operation 908 may be performed by buffing or polishing the exterior surface using the soft abrasive material with a light force ranging between 20 and 300 grams. The movement of the soft abrasive material and the light force may shear any exposed ends of the fibers without adversely affecting the finish or surface of the polymer matrix or binder.

In one embodiment of operation 908, the exterior surface of the non-conductive housing segment is polished using a laser-based process. For example, the exterior surface of the non-conductive housing segment may be exposed to a laser that ablates or melts any exposed or non-encapsulated ends of the fibers that extend or protrude from the exterior surface to produce a polished surface. In some cases, the laser power, laser pulse duration, and/or laser wavelength is configured to melt or ablate the ends of the fibers without adversely affecting the finish or surface of the polymer matrix or binder. In some implementation, the laser may heat or partially melt the exposed polymer matrix or binder to reflow the polymer along the surface to create a smooth or polished surface.

Operation 908 may include other surface treatment operations that help to form a smooth fiber-free exterior surface. In some cases, operation 908 may include a blasting operation using a bead or abrasive media, a buffing operation using a polishing cloth or other material, or other surface treatment techniques or operations.

With regard to example process 900, one or more additional steps may be performed that are omitted from this description for purpose of clarity. Similarly, one or more of the operations described above may be optional depending on the particular implementation.

Figure 10:
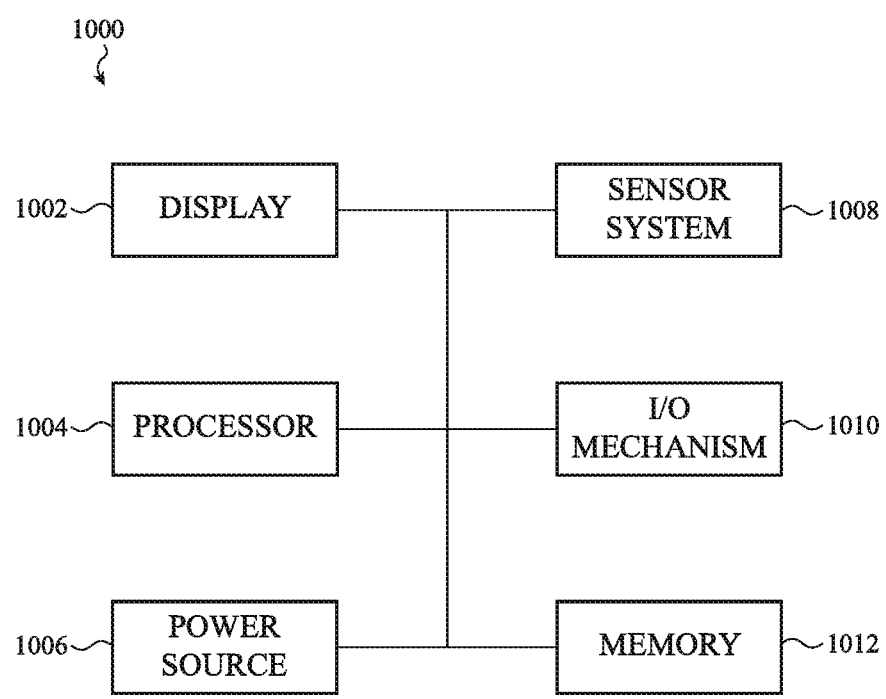
FIG. 10 depicts an example electronic device.

FIG. 10 shows a sample electrical block diagram of an electronic device 1000, which electronic device may in some cases take the form of the device 100 described with reference to FIGS. 1A-1C or other devices described herein. The electronic device 1000 may include a display 1002 (e.g., a light-emitting display), a processor 1004, a power source 1006, a memory 1008 or storage device, a sensor system 1010, or an input/output (I/O) mechanism 1012 (e.g., an input/output device, input/output port, or haptic input/output interface). The processor 1004 may control some or all of the operations of the electronic device 1000. The processor 1004 may communicate, either directly or indirectly, with some or all of the other components of the electronic device 1000. For example, a system bus or other communication mechanism 1014 can provide communication between the display 1002, the processor 1004, the power source 1006, the memory 1008, the sensor system 1010, and the I/O mechanism 1012.

The processor 1004 may be implemented as any electronic device capable of processing, receiving, or transmitting data or instructions, whether such data or instructions is in the form of software or firmware or otherwise encoded. For example, the processor 1004 may include a microprocessor, a central processing unit (CPU), an application-specific integrated circuit (ASIC), a digital signal processor (DSP), a controller, or a combination of such devices. As described herein, the term "processor" is meant to encompass a single processor or processing unit, multiple processors, multiple processing units, or other suitably configured computing element or elements. In some embodiments, the processor 1004 may function as the controller described with reference to FIG. 1C.

It should be noted that the components of the electronic device 1000 can be controlled by multiple processors. For example, select components of the electronic device 1000 (e.g., the sensor system 1010) may be controlled by a first processor and other components of the electronic device 1000 (e.g., the display 1002) may be controlled by a second processor, where the first and second processors may or may not be in communication with each other.

The power source 1006 can be implemented with any device capable of providing energy to the electronic device 1000. For example, the power source 1006 may include one or more batteries or rechargeable batteries. Additionally or alternatively, the power source 1006 may include a power connector or power cord that connects the electronic device 1000 to another power source, such as a wall outlet.

The memory 1008 may store electronic data that can be used by the electronic device 1000. For example, the memory 1008 may store electrical data or content such as, for example, audio and video files, documents and applications, device settings and user preferences, timing signals, control signals, and data structures or databases. The memory 1008 may include any type of memory. By way of example only, the memory 1008 may include random access memory, read-only memory, Flash memory, removable memory, other types of storage elements, or combinations of such memory types.

The electronic device 1000 may also include one or more sensor systems 1010 positioned almost anywhere on the electronic device 1000. The sensor system(s) 1010 may sense one or more type of parameters, such as but not limited to, force or pressure on the display 1002, a crown, a button, or a housing of the electronic device 1000; light; touch; heat; movement; relative motion; biometric data (e.g., biological parameters) of a user; and so on. For example, the sensor system(s) 1010 may include a watch crown sensor system, a heat sensor, a position sensor, a light or optical sensor, an accelerometer, a pressure transducer, a gyroscope, a magnetometer, a bio-authentication sensor, a health monitoring sensor, and so on. Additionally, the one or more sensor systems 1010 may utilize any suitable sensing technology, including, but not limited to, capacitive, ultrasonic, resistive, optical, ultrasound, piezoelectric, and thermal sensing technology.

The I/O mechanism 1012 may transmit or receive data from a user or another electronic device. The I/O mechanism 1012 may include the display 1002, a touch sensing input surface, one or more buttons (e.g., a graphical user interface "home" button), a crown, one or more cameras, one or more microphones or speakers, one or more ports such as a microphone port, and/or a keyboard. Additionally or alternatively, the I/O mechanism 1012 may transmit electronic signals via a communications interface, such as a wireless, wired, and/or optical communications interface. Examples of wireless and wired communications interfaces include, but are not limited to, cellular and Wi-Fi communications interfaces. In some embodiments, the electronic device 1000 may configure one or more of the housing segments 112 described herein to operate as an antenna and/or may configure the electronic device 1000 to communicate in one or more of the wireless frequency bands described with reference to FIG. 11 (or other wireless frequency bands).

Figure 11:
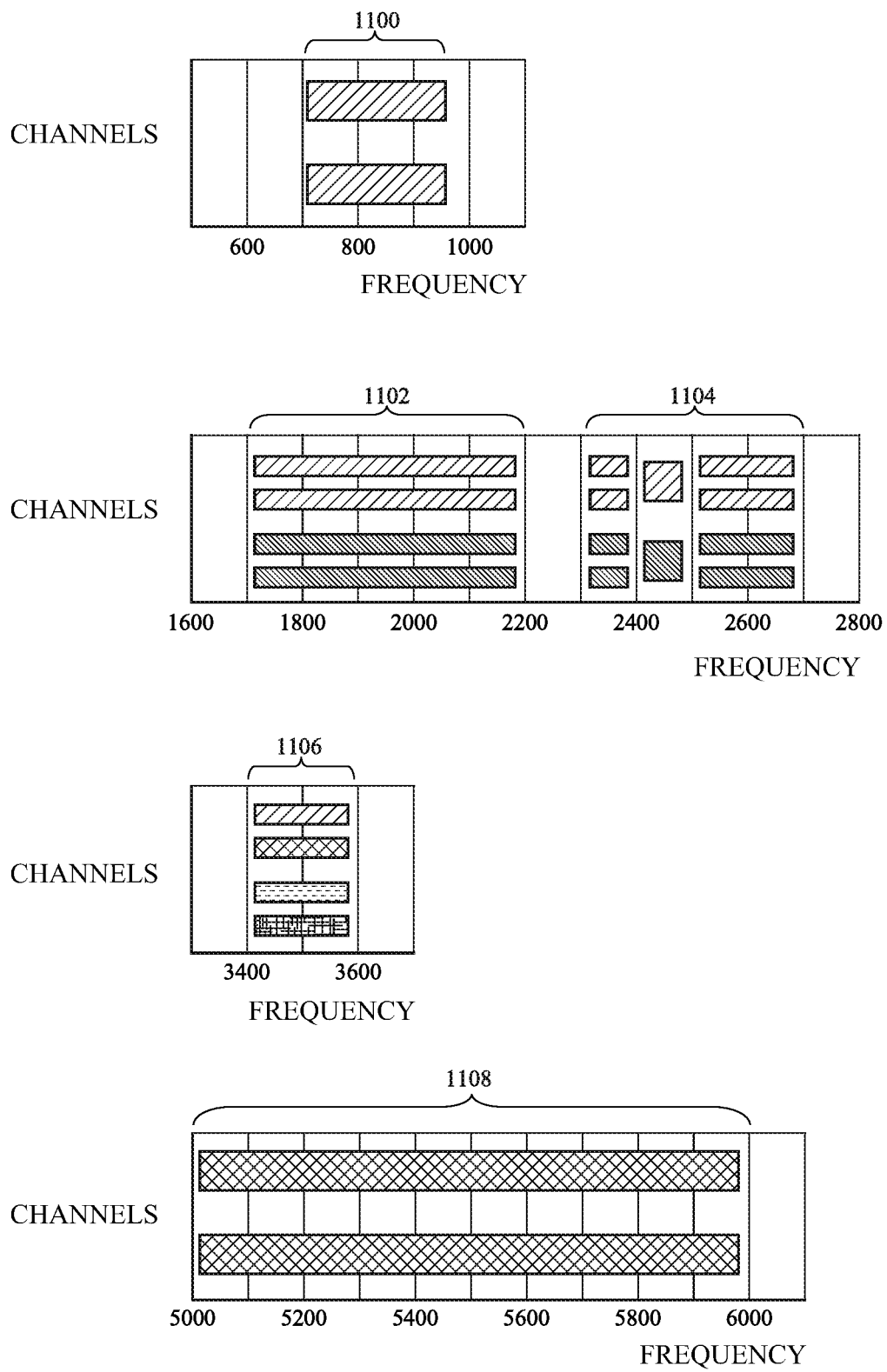
FIG. 11 depicts a set of wireless frequency bands that may be used for wireless communication.

Turning now to FIG. 11, there is shown a set of wireless frequency bands 1100, 1102, 1104, 1106, 1108 that may be used for wireless communication. The wireless frequency bands include a low wireless frequency band 1100 extending from about 600-950 MHz, a mid wireless frequency band 1102 extending from about 1700-2200 MHz, a high wireless frequency band 1104 extending from about 2300-2800 MHz, a B42 wireless frequency band 1106 extending from about 3400-3600 MHz (currently defined for use in the European Union (EU) and Japan), and a 5G, Wi-Fi, or B46 band 1108 extending from about 5000-6000 MHz.

In some embodiments of the devices and housings described herein, multiple housing segments disposed along a sidewall of a device housing may be operated individually or simultaneously as antennas, in the wireless frequency bands described with reference to FIG. 11 or in other wireless frequency bands. For example, in some cases, wireless communication circuitry may be operable to communicate in different wireless communication modes, using the same or different combinations of antennas (including, in some cases, housing segments that are configured to operate as antennas).

In some embodiments, wireless communication circuitry may be configured to operate in a first wireless communication mode (e.g., a 2×2 MIMO wireless communication mode). In the first wireless communication mode, the wireless communication circuitry may be configured to use the second and third housing segments 112b, 112c described with reference to FIG. 2A or 3A as different antennas for wireless communication. In some embodiments, wireless communication in the first wireless communication mode may occur in the low wireless frequency band 1100. Alternatively, the wireless communication circuitry may be operated in a second wireless communication mode (e.g., a 4×4 MIMO wireless communication mode). In the second wireless communication mode, the wireless communication circuitry may be configured to use the first, second, third, and fourth housing segments 112a, 112b, 112c, 112d described with reference to FIG. 2A or 3A as different antennas for wireless communication. In some embodiments, wireless communication in the second wireless communication mode may occur in the mid wireless frequency band 1102 or the high wireless frequency band 1104. Alternatively, the wireless communication circuitry may be operated in a third wireless communication mode (e.g., another 4×4 MIMO wireless communication mode). In the third wireless communication mode, the wireless communication circuitry may be configured to use the second housing segment 112b in combination with the sixth housing segment 112f, a first interior antenna 324 (described with reference to FIG. 3A), a second interior antenna 326 (described with reference to FIG. 3A), and the fourth housing segment 112d in combination with the sixth housing segment 112f as different antennas for wireless communication. In some embodiments, wireless communication in the third wireless communication mode may occur in the B42 wireless frequency band 1106. Alternatively, the wireless communication circuitry may be operated in a fourth wireless communication mode (e.g., another 2×2 MIMO wireless communication mode). In the fourth wireless communication mode, the wireless communication circuitry may be configured to use the first and second interior antennas 324a, 324b described with reference to FIG. 3A for wireless communication in the 5G, Wi-Fi, or B46 wireless frequency band 1108.

In general, it can be useful to configure antennas with the greatest physical separation to operate simultaneously in a wireless communication mode that requires two antennas. Thus, two-antenna wireless communication modes may be supported by antennas positioned on diagonally opposite corners of a device, when possible.

The housing segments described with reference to FIGS. 2B-2E may also be used in different combinations (or individually) to communicate in one or more of the wireless frequency bands described with reference to FIG. 11.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An electronic device comprising:
a display;
a housing at least partially surrounding the display, the housing comprising:
a first housing segment defining a first portion of an exterior sidewall of the housing, configured to operate as an antenna, and including a first interlock feature defining a first opening;
a second housing segment defining a second portion of the exterior sidewall of the housing and including a second interlock feature defining a second opening that is substantially aligned with the first opening; and
a non-conductive housing segment at least partially filling the first opening and the second opening, mechanically coupling the first housing segment to the second housing segment, electrically insulating the first housing segment from the second housing segment, and defining a third portion of the exterior sidewall of the housing, the non-conductive housing segment comprising a polymer material having an array of fibers that are substantially aligned along a fiber direction that is transverse to the third portion of the exterior sidewall.

2. The electronic device of claim 1, wherein:
the array of fibers are located proximate to the third portion of the exterior sidewall; and
the fiber direction is substantially perpendicular to the third portion of the exterior sidewall.

3. The electronic device of claim 1, wherein:
the first interlock feature includes a protrusion that is positioned along an inner portion of the first housing segment;
the first opening extends into the protrusion;
the first interlock feature includes a first transverse opening that extends into the protrusion and intersects the first opening; and
the non-conductive housing segment at least partially fills the first transverse opening.

4. The electronic device of claim 1, wherein:
the first interlock feature includes a first interlock surface;
the first interlock feature includes a threaded hole that extends into the first interlock surface;
the threaded hole is substantially parallel to the first opening; and
the non-conductive housing segment at least partially fills the threaded hole.

5. The electronic device of claim 1, wherein:
the first housing segment defines a first interior surface;
the second housing segment defines a second interior surface; and
the non-conductive housing segment at least partially encapsulates the first interior surface and the second interior surface to define a waterproof seal.

6. The electronic device of claim 1, wherein:
the polymer material comprises one or more of polycarbonate, acrylonitrile butadiene styrene (ABS), polyether ether ketone (PEEK), polybutylene terephthalate (PBT), or polyamide; and
the array of fibers comprises one or more of glass fiber, carbon fiber, or aramid fiber.

7. The electronic device of claim 1, wherein:
the third portion of the exterior sidewall of the housing has a polished surface;
the polished surface is substantially free of exposed fibers.

8. The electronic device of claim 1, wherein the third portion defines a curved exterior surface of the exterior sidewall.

9. The electronic device of claim 8, wherein:
a first set of fibers of the array of fibers is aligned transverse to a first portion of the curved exterior surface; and
a second set of fibers of the array of fibers is aligned transverse to a second portion of the curved exterior surface.

10. An electronic device comprising:
a display;
a housing defining four corners that surround the display and comprising:
a first housing segment defining a first portion of an exterior surface that includes a first corner of the housing, configured to operate as an antenna, and including a first opening;
a second housing segment defining a second portion of the exterior surface and including a second opening that is substantially aligned with the first opening;
a non-conductive housing segment positioned between the first housing segment and the second housing segment, at least partially filling the first opening and the second opening, and defining a third portion of the exterior surface, the non-conductive housing segment comprising a polymer material and an array of fibers dispersed within the polymer material, the array of fibers aligned along one or more directions that are substantially perpendicular to the third portion of the exterior surface.

11. The electronic device of claim 10, wherein:
the second housing segment defines a second corner of the housing;
the housing defines a long side and a short side; and
the first corner and second corner are positioned along the short side of the housing.

12. The electronic device of claim 11, wherein:
the first housing segment and the second housing segment are operably coupled to wireless communication circuitry;
the first housing segment is operable to transmit wireless signals using a first frequency band; and
the second housing segment is operable to transmit wireless signals using a second frequency band that is different than the first frequency band.

13. The electronic device of claim 12, wherein:
the wireless communication circuitry is operable to electrically couple the first housing segment to the second housing segment to transmit wireless signals using a third frequency band that is different from the first and second frequency bands.

14. The electronic device of claim 10, wherein:
the first opening is defined by a threaded hole; and
the non-conductive housing segment extends at least partially into the threaded hole.

15. The electronic device of claim 10, wherein:
a portion of the non-conductive housing segment extends along an inner portion of the first corner of the first housing segment; and
the portion has a minimum thickness that is greater than 0.5 mm.

16. The electronic device of claim 10, wherein:
the third portion of the exterior surface defines a curved profile;
the array of fibers comprises a first set of fibers that is perpendicular to a first portion of the curved profile and a second set of fibers that is perpendicular to a second portion of the curved profile.

17. The electronic device of claim 16, wherein a first fiber direction of the first set of fibers is different than a second fiber direction of the second set of fibers.

* * * * *